(12) United States Patent
Maki

(10) Patent No.: US 11,476,258 B2
(45) Date of Patent: Oct. 18, 2022

(54) SEMICONDUCTOR DEVICE INCLUDING SHORT-CIRCUIT PREVENTION STRUCTURE AND MANUFACTURING METHOD THEREOF

(71) Applicant: Renesas Electronics Corporation, Tokyo (JP)

(72) Inventor: Yukio Maki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/399,035

(22) Filed: Apr. 30, 2019

(65) Prior Publication Data

US 2019/0259767 A1    Aug. 22, 2019

Related U.S. Application Data

(63) Continuation of application No. 14/462,335, filed on Aug. 18, 2014, now abandoned.

(30) Foreign Application Priority Data

Sep. 17, 2013    (JP) ................. 2013-191922

(51) Int. Cl.
*H01L 29/51*    (2006.01)
*H01L 27/11*    (2006.01)

(52) U.S. Cl.
CPC ...... *H01L 27/1108* (2013.01); *H01L 27/1112* (2013.01); *H01L 29/518* (2013.01)

(58) Field of Classification Search
CPC .................................................. H01L 29/518

USPC ......................................................... 257/368
See application file for complete search history.

(56) References Cited

U.S. PATENT DOCUMENTS

| | | | |
|---|---|---|---|
| 6,853,022 B2 | 2/2005 | Koga et al. | |
| 2004/0005755 A1 | 1/2004 | Moniwa | |
| 2004/0014323 A1 | 1/2004 | Shimizu | |
| 2004/0032764 A1 | 2/2004 | Koga et al. | |
| 2004/0120179 A1* | 6/2004 | Ishigaki | G11C 11/412 365/149 |
| 2007/0158691 A1 | 7/2007 | Maki | |

(Continued)

FOREIGN PATENT DOCUMENTS

| | | |
|---|---|---|
| JP | H11-354787 A | 12/1999 |
| JP | 2004-055826 A | 2/2004 |

(Continued)

OTHER PUBLICATIONS

Japanese Office Action dated Nov. 1, 2016 with a partial English translation.

(Continued)

*Primary Examiner* — Hsin Yi Hsieh
(74) *Attorney, Agent, or Firm* — McDermott Will & Emery LLP

(57) ABSTRACT

A semiconductor device includes a semiconductor substrate having a main surface, a gate electrode formed on the main surface of the semiconductor substrate, a side-wall oxide film formed on a side wall of the gate electrode, a first insulating layer formed on the gate electrode and containing silicon nitride, and a second insulating layer formed between the gate electrode and the first insulating layer and containing silicon oxide.

6 Claims, 21 Drawing Sheets

(56) References Cited

U.S. PATENT DOCUMENTS

| | | | |
|---|---|---|---|
| 2009/0224330 A1* | 9/2009 | Hong .................... | H01L 27/11 257/368 |
| 2011/0108930 A1* | 5/2011 | Cheng ............... | H01L 21/76831 257/412 |
| 2011/0156107 A1* | 6/2011 | Bohr .................. | H01L 29/4966 257/288 |

FOREIGN PATENT DOCUMENTS

| | | |
|---|---|---|
| JP | 2004-79696 A | 3/2004 |
| JP | 2008-078331 A | 4/2008 |

OTHER PUBLICATIONS

Chinese Office Action dated Apr. 2, 2018, with an English translation.
Machine Translation of Yamamura JP H11-354787 dated Dec. 24, 1999.

* cited by examiner

SEMICONDUCTOR DEVICE INCLUDING SHORT-CIRCUIT PREVENTION STRUCTURE AND MANUFACTURING METHOD THEREOF

RELATED APPLICATIONS

This Application is a Continuation Application of U.S. patent application Ser. No. 14/462,335 filed on Aug. 18, 2014.

Cross-Reference to Related Applications

The disclosure of Japanese Patent Application No. 2013-191922 filed on Sep. 17, 2013 including the specification, drawings and abstract is incorporated herein by reference in its entirety.

BACKGROUND

The present invention relates to a semiconductor device and a manufacturing method thereof.

The higher-degree integration and increasing miniaturization of a semiconductor device has increased the tendency toward such a multi-layer configuration in which the plurality of minute elements included in the semiconductor device are provided so as to overlap each other in plan view. Such a multi-layer configuration of a semiconductor device is shown in, e.g., Japanese Unexamined Patent Publication No. 2004-79696 (Patent Document 1).

The semiconductor device disclosed in Japanese Unexamined Patent Publication No. 2004-79696 is a nonvolatile memory referred to as SRAM (Static Random Access Memory). In the SRAM disclosed in Japanese Unexamined Patent Publication No. 2004-79696, to an SRAM circuit using a thin-film transistor referred to as a so-called TFT (Thin Film Transistor) as a load transistor, a capacitor as a so-called DRAM (Dynamic Random Access Memory) has been added. In the SRAM described in the publication, charges are held in the capacitor as a replacement for a storage node portion and a potential at the capacitor is held by a so-called flip-flop circuit included in the SRAM circuit.

RELATED ART DOCUMENT

Patent Document

[Patent Document 1]
Japanese Unexamined Patent Publication No. 2004-79696

SUMMARY

In a semiconductor device as described in the publication mentioned above, an oxide film may be formed over a side wall of the gate electrode of a transistor. In this case, as the semiconductor device is increasingly miniaturized, the gate electrode may be curved toward the main surface of a semiconductor substrate during the formation of the oxide film over the side wall of the gate electrode. This may result in the occurrence of a short circuit between the gate electrode and either of the source/drain regions of the transistor.

Other problems and novel features of the present invention will become apparent from a statement in the present specification and the accompanying drawings.

In a semiconductor device in an embodiment, a first insulating layer formed over a gate electrode and containing a silicon nitride has an upper surface having a depressed portion formed in a region over a second electrode layer of the gate electrode containing a silicide.

In the semiconductor device in the embodiment, the first insulating film has the upper surface having the depressed portion. This can suppress the curving of the gate electrode toward the main surface of a semiconductor substrate during the formation of a side-wall oxide film. As a result, it is possible to suppress the occurrence of a short circuit between the gate electrode and either of the source/drain regions of a transistor.

DETAILED DESCRIPTION

A description will be given below of an embodiment on the basis of the drawings.

Figure 1:
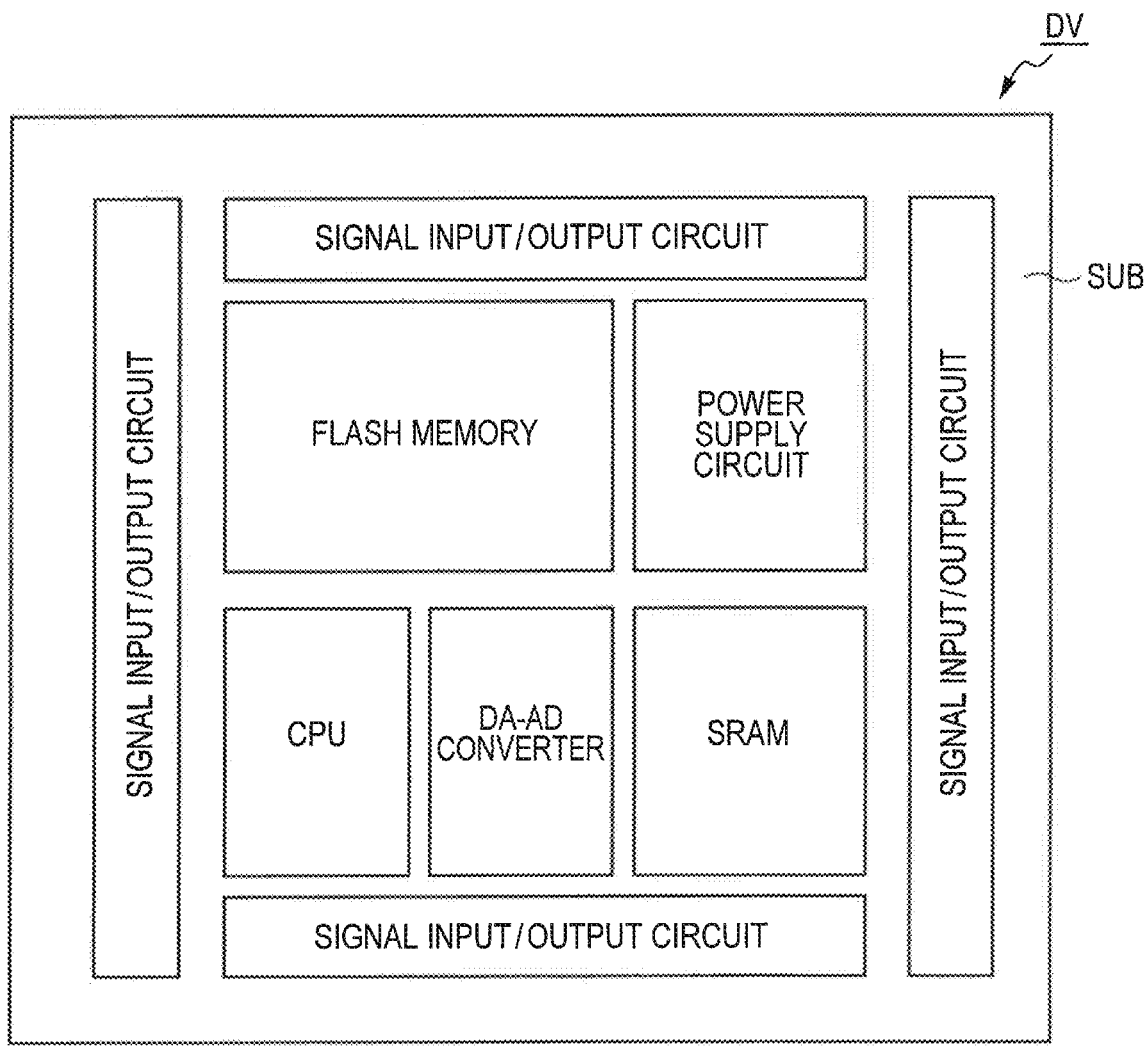
FIG. 1 is a schematic plan view showing a configuration of a semiconductor device in an embodiment.

Referring to FIG. 1, in a semiconductor device DV in the present embodiment, over the main surface of a semiconductor substrate SUB such as a semiconductor wafer made of, e.g., a silicon single crystal, a plurality of types of circuits are formed. Examples of the circuits included in the semiconductor device DV include a signal input/output circuit, a DA(Digital/Analog)-AD converter, a power supply circuit, a CPU (Central Processing Unit), a Flash memory, and a SRAM (Static Random Access Memory).

The function of each of the circuits included in the semiconductor device DV is as follows. First, in the signal input/output circuit, the inputting/outputting of an electric signal to/from a circuit placed outside the semiconductor device DV or the like is performed. In the DA-AD converter, conversion between an analog signal and a digital signal is performed. The power supply circuit supplies the electric power required to drive the semiconductor device DV and controls the electric power. In the CPU, a logical arithmetic operation using a logic circuit is performed. In each of the Flash memory and the SRAM, data is stored.

Next, a description will be given of a circuit configuration of a SRAM memory cell used in the semiconductor device in the present embodiment.

Figure 2:
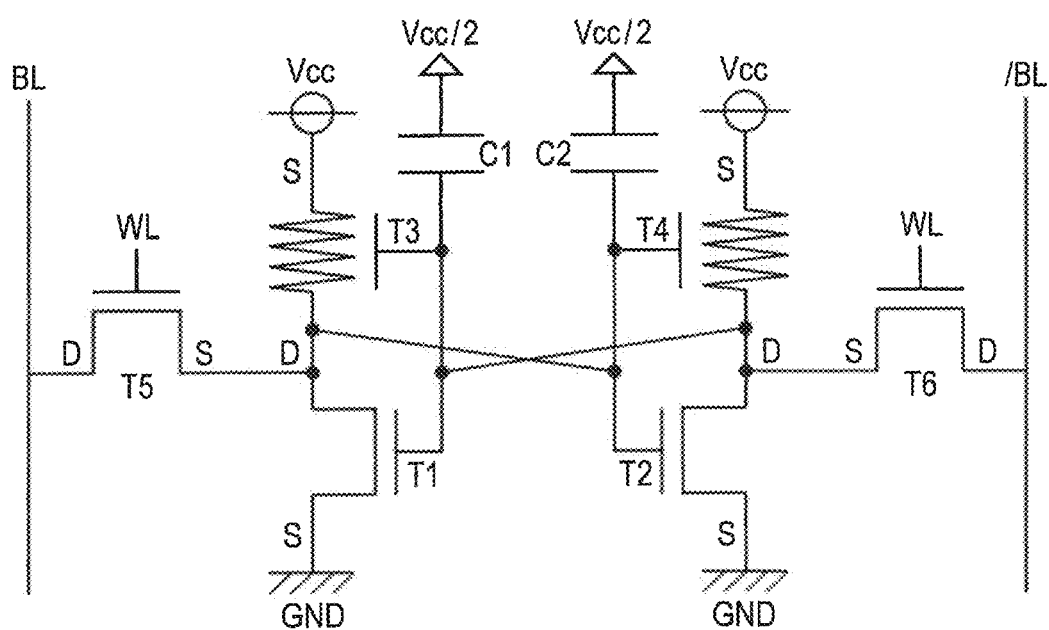
FIG. 2 is an equivalent circuit diagram of the memory cell included in the semiconductor device in the embodiment.

Referring to FIG. 2, the SRAM memory cell has, e.g., a bit line pair BL and /BL, a word line WL, a flip-flop circuit, a pair of access transistors T5 and T6, and a pair of capacitors C1 and C2.

The flip-flop circuit has two CMOS (Complementary Metal Oxide Semiconductor) inverters. One of the CMOS inverters includes a driver transistor T1 and a load transistor T3. The other CMOS inverter includes a driver transistor T2 and a load transistor T4.

The SRAM is a semiconductor storage device which includes the flip-flop circuit to eliminate the need for a process referred to as refreshing in which charges stored as information are restored to an original state at predetermined intervals. The SRAM in the present embodiment further includes capacitors C1 and C2 equivalent to DRAMs.

In the flip-flop circuit, the respective gate electrodes of the driver transistor T1 and the load transistor T3 and one of the electrodes of the capacitor C1 are coupled to a source S of the access transistor T6. The source S of the access transistor T6 is electrically coupled to each of drains D of the driver transistor T2 and the load transistor T4, and the region coupled thereto serves as a first storage node portion.

The respective gate electrodes of the driver transistor T2 and the load transistor T4 and one of the electrodes of the capacitor C2 are electrically coupled to the source S of the access transistor T5. The source S of the access transistor T5 is electrically coupled to each of the drains D of the driver transistor T1 and the load transistor T3, and the region coupled thereto functions as a second storage node portion.

Each of the sources S of the driver transistors T1 and T2 is electrically coupled to a GND potential. Each of the sources S of the load transistors T3 and T4 is electrically coupled to a Vcc line (power supply line) for applying a voltage Vcc. Each of the other electrodes of the capacitors C1 and C2 is electrically coupled to a Vcc/2 line for applying a voltage Vcc/2 corresponding to ½ of the foregoing voltage Vcc. The pair of bit lines BL and /BL are respectively coupled to the drains D of the pair of access transistors T5 and T6.

The driver transistors T1 and T2 included in the flip-flop circuit are, e.g., n-channel MOS transistors. The load transistors T3 and T4 are, e.g., p-channel TFTs. The access transistors T5 and T6 are, e.g., n-channel MOS transistors. Thus, the SRAM in the present embodiment is a so-called Advanced SRAM in which the load transistors are TFTs and to which the capacitors equivalent to DRAMs have been added.

Next, using FIG. 3, a description will be given of a specific configuration of a semiconductor device corresponding to the SRAM memory cell shown in FIG. 2. However, the cross-sectional view of FIG. 3 is not a drawing which shows the aspect of a cross section in a specified region, but is a combination of drawings collected to illustrate the forms shown by the individual elements such as the transistors and the capacitors shown in FIG. 2 in the semiconductor device.

Figure 3:
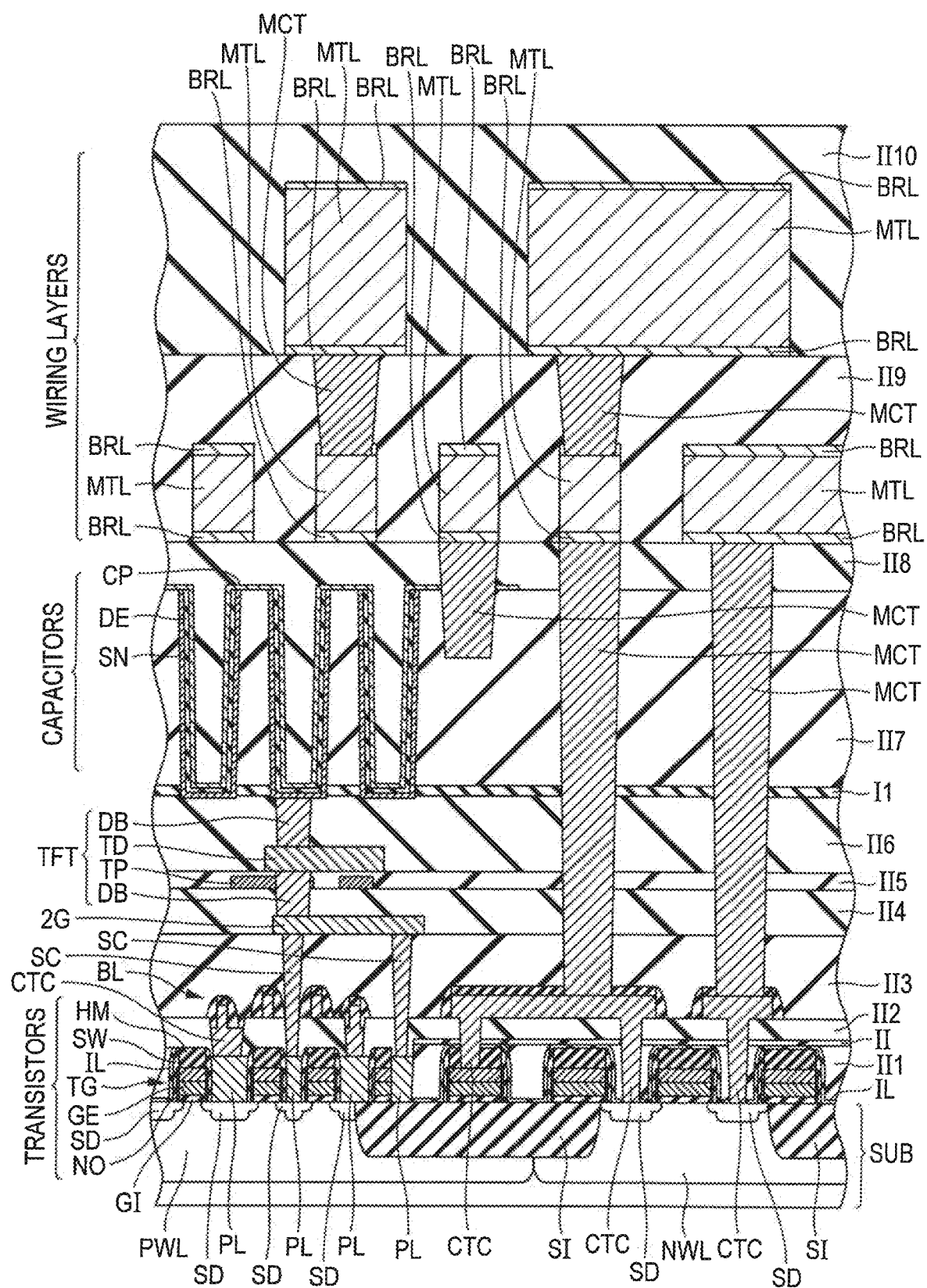
FIG. 3 is a schematic cross-sectional view showing a specific configuration corresponding to the equivalent circuit of FIG. 2.

Referring to FIG. 3, the left side of the drawing shows the region where the SRAM memory cell is formed and the right side of the drawing shows the region where a peripheral circuit is formed. The semiconductor device according to the present embodiment is formed in the main surface of the p-type semiconductor substrate SUB made of, e.g., a silicon single crystal.

The main surface of the semiconductor substrate SUB is electrically isolated by a STI (Shallow Trench Isolation). The STI is formed by embedding an insulating film SI in a trench formed in the main surface of the semiconductor substrate SUB. In the main surface of the semiconductor substrate SUB electrically isolated by the STI, a transistor TG for the SRAM memory cell and the transistor TG for the peripheral circuit are formed.

In the memory cell formation region on the left side of the drawing, a p-type well region PWL is formed in the main surface of the semiconductor substrate SUB. On the other hand, in the peripheral circuit region on the right side of the drawing, the p-type well region PWL and an n-type well region NWL are formed. Each of the transistor TG for the SRAM memory cell and the transistor TG for the peripheral circuit has a pair of source/drain regions SD, a gate insulating film GI, and a gate electrode GE.

The pair of source/drain regions SD are formed in the main surface of the semiconductor substrate SUB to be spaced apart from each other. The pair of source/drain regions SD are formed with a channel formation region located under the gate electrode GE being interposed therebetween. The gate electrode GE is formed over the main surface of the semiconductor substrate SUB interposed between the pair of source/drain regions SD via the gate insulating film GI.

Insulating films HM are formed over the gate electrodes GE. Each of the insulating films HM is formed of a laminate structure including a silicon dioxide film formed using, e.g., a TEOS (Tetra Ethyl Ortho Silicate) as a raw material and a silicon nitride film. The insulating films HM function as stopper films for etching when a so-called self-alignment process is performed using the insulating films HM as a mask.

Over the side walls of the gate insulating film GI and each of the gate electrodes GE, insulating films (side-wall oxide films) NO are formed. The insulating films NO will also be described later in detail. Over the side walls of each of laminate structures including the gate insulating film GI, the gate electrode GE and the insulating film HM, side-wall insulating films SW are formed. Similarly to the insulating films HM, the side-wall insulating films SW also function as stopper films for etching when a so-called self-alignment process is performed using the side-wall insulating films SW as a mask.

Note that, over the gate electrodes GE, the insulating films HM are formed, but each of the gate electrodes GE is electrically coupled to another wiring in a region not shown in the cross-sectional view of FIG. 3 and extending in the depth direction of a paper sheet with FIG. 3.

A liner film IL, an interlayer insulating film I1, and an insulating film II are formed successively in ascending order over the semiconductor substrate SUB so as to cover the respective transistors TG for the SRAM memory cell and the peripheral circuit from thereover. In the region where the SRAM memory cell is to be formed, the liner film IL, the interlayer insulating film I1, and the insulating film II over the source/drain regions SD have been selectively removed and plug conductive layers PL are formed over the portions from which the liner film IL, the interlayer insulating film I1, and the insulating film II have been removed.

Over the insulating films HM and II and the like, an interlayer insulating film II2 is formed so as to cover the respective transistors TG for the SRAM memory cell and the peripheral circuit from thereover. In the region where the SRAM memory cell is to be formed, contact holes reaching the plug conductive layers PL are formed in the interlayer insulating film II2 and, in the contact holes, contact conductive layers CTC are formed. Over the interlayer insulating film II2, wiring layers such as the bit lines BL extend so as to be electrically coupled to the contact conductive layers CTC.

In the region where the peripheral circuit is to be formed, contact holes are formed so as to extend from the upper surface of the interlayer insulating film II2 and reach the source/drain regions SD and the gate electrodes GE and, in the contact holes, the contact conductive layers CTC are formed. Over the interlayer insulating film II2, the wiring layers extend so as to be electrically coupled to the contact conductive layers CTC.

Over the interlayer insulating film II2, interlayer insulating films II3, II4, II5, and II6 each made of, e.g., a silicon dioxide film are formed in succession so as to cover the wiring layers. An insulating film I1 made of, e.g., a silicon nitride film is formed so as to come in contact with the upper surface of the interlayer insulating film II6. In addition, interlayer insulating films II7, II8, II9, and II10 each made of, e.g., a silicon dioxide film are formed in succession so as to come in contact with the upper surface of the insulating film I1.

Over the interlayer insulating film II3, a lower-layer interconnect 2G is formed. The lower-layer interconnect 2G is electrically coupled to the source/drain regions SD of the transistors TG via, e.g., conductive layers SC and the plug conductive layers PL. The lower-layer interconnect 2G is preferably formed in a region roughly overlapping the capacitors in plan view. The lower-layer interconnect 2G is preferably formed of, e.g., a polycrystalline silicon film doped with an impurity (hereinafter referred to as "doped polysilicon"). When the transistors TG formed in the lower layer and the like are, e.g., n-channel transistors, the lower-layer interconnect 2G may also be formed of polycrystalline silicon containing, e.g., n-type impurity ions so as to allow easy electrical coupling to the transistors TG.

Over the interlayer insulating film II4, a conductive layer TP is formed. The conductive layer TP is a semiconductor layer made of polycrystalline silicon (polysilicon) and includes the channel region of each of TFTs as the load transistors T3 and T4 of the SRAM and a pair of source/drain regions having the channel region interposed therebetween. In the conductive layer TP, a part of a power supply line for supplying power to the TFTs is included. The conductive layer TP is preferably formed in the region roughly overlapping the capacitors in plan view.

Over the interlayer film II5, a gate electrode TD of each of the TFTs is formed. Preferably, the gate electrode TD is a semiconductor layer containing doped polysilicon. Preferably, electrical coupling is provided between the gate electrode TD and the lower-layer interconnect 2G by a conductive layer referred to as a data node contact DB. While extending from the gate electrode TD toward the lower-layer interconnect 2G, the data node contact DB comes in contact with an end portion of the conductive layer TP to be electrically coupled to the conductive layer TP.

The data node contact DB is a conductive layer for forming the flip-flip circuit (cross-coupling) of the SRAM and is formed of, e.g., a semiconductor layer containing doped polysilicon, similarly to the gate electrode TD. Preferably, the data node contact DB is formed so as to extend from the gate electrode TD to the lower-layer interconnect 2G through the interlayer insulating films II4 and II5 in a direction generally perpendicular to the main surface of the semiconductor substrate SUB.

The data node contact DB may also be formed so as to electrically couple, e.g., the capacitors in a layer over the gate electrode TD to the gate electrode TD or may be formed so as to electrically couple, e.g., the conductive layers SC in a layer under the lower-layer interconnect 2G to the lower-layer interconnect 2G. In this case, the data node contact DB may also be formed so as to extend, e.g., from the capacitor through the gate electrode TD, the conductive layer TP, and the lower-layer interconnect 2G and reach the conductive layer PL.

Over the interlayer insulating film II6, the capacitors are formed. Each of the capacitors has a storage node SN serving as the lower electrode thereof, a cell plate CP serving as the upper electrode thereof, and a capacitor dielectric film DE. The capacitor dielectric film DE is interposed between the storage node SN and a cell plate CR. The storage node SN of the capacitor comes in contact with the upper surface of the data node contact DB to be electrically coupled to the data node contact DB.

Over, e.g., the interlayer insulating films II8 and II9 located above the capacitors, metal wires MTL are formed. Each of the metal wires MTL is made of, e.g., aluminum, an aluminum-copper alloy, copper, tungsten, or the like. Preferably, the upper and lower surfaces of the metal wires MTL are covered with barrier metals BRL made of, e.g., tantalum, titanium, titanium nitride, or the like. The coupling between the individual metal wires MTL described above and the coupling between the metal wires MTL and the bit lines BL are preferably provided by metal contact conductive layers MCT made of, e.g., copper, tungsten, or the like.

Next, a description will be given of a specific configuration of the semiconductor device in the present embodiment.

Figure 4:
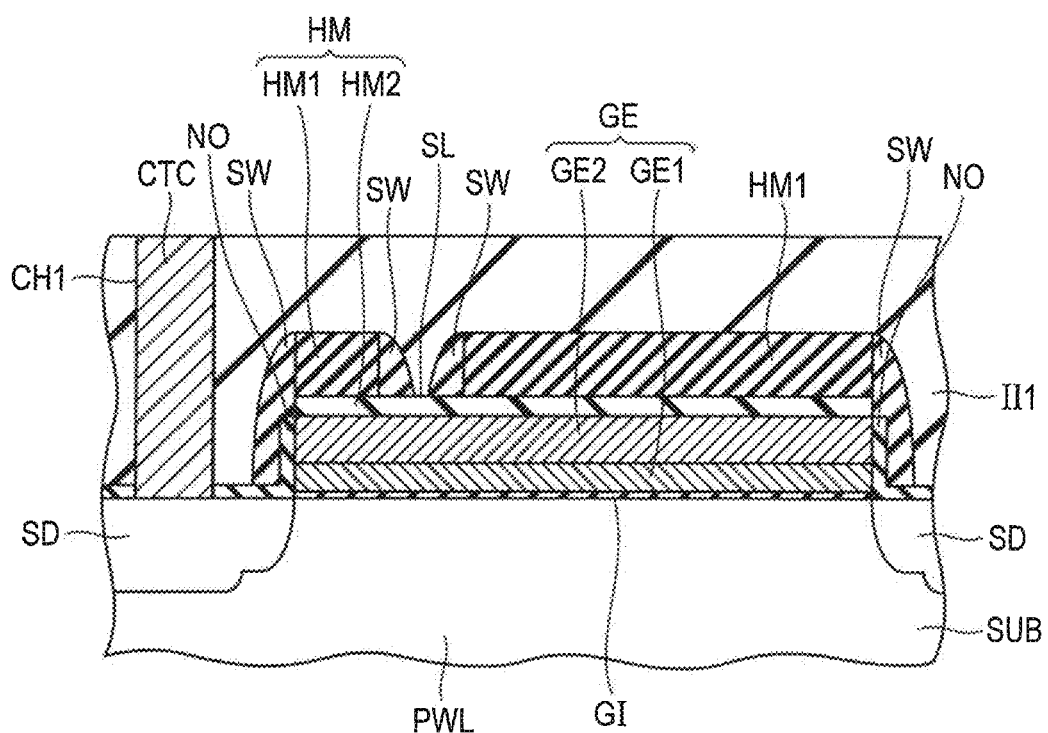
FIG. 4 is a schematic cross-sectional view showing a configuration in the vicinity of a gate electrode formed over the main surface of the semiconductor substrate of the semiconductor device in the embodiment.
Figure 5:
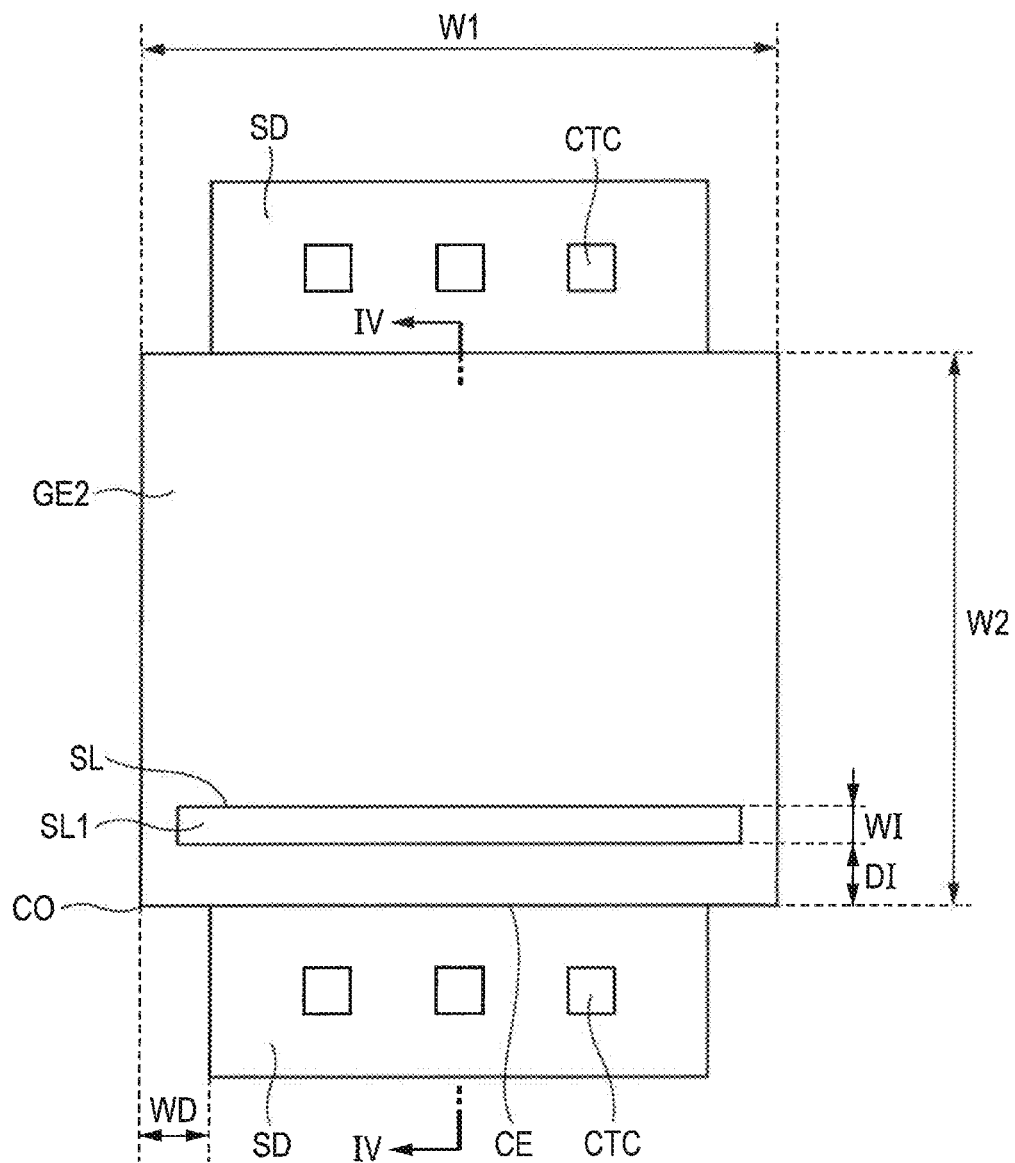
FIG. 5 is a schematic plan view showing the configuration in the vicinity of the gate electrode formed over the main surface of the semiconductor substrate of the semiconductor device in the embodiment.

Referring to FIGS. 4 and 5, a description will be given of an example of each of the transistors of the semiconductor device in the present embodiment. Note that, in FIG. 5, for the convenience of illustration, the insulating films NO and the interlayer insulating film II1 each shown in FIG. 4 are not shown. The transistor has the pair of source/drain regions SD formed in the p-type well PWL as an active region in the main surface of the semiconductor substrate SUB, and the gate electrode GE formed over the main surface of the semiconductor substrate SUB interposed between the pair of source/drain regions SD via the gate insulating film GI.

The gate electrode GE includes a first electrode layer GE1 containing silicon, and a second electrode layer GE2 formed over the first electrode layer GE1 and containing a silicide. That is, the gate electrode GE has a so-called polycide structure in which, e.g., the doped polysilicon film GE1 and the tungsten silicide film GE2 are stacked.

Over the gate electrode GE, the insulating film HM is formed. The insulating film HM includes a first insulating layer HM1 formed over the gate electrode GE and containing a silicon nitride and a second insulating film HM2 formed between the gate electrode GE and the first insulating layer HM1 and containing a silicon dioxide. That is, the insulating film HM is formed of a laminate structure including, e.g., the silicon nitride (SiN) film HM1 and the silicon dioxide ($SiO_2$) film (TEOS film) HM2 formed using the TEOS as a raw material.

The silicon nitride film HM1 has an upper surface opposite to the main surface side of the semiconductor substrate SUB and having a depressed portion SL formed in a region over the tungsten silicide film GE2. The depressed portion SL is formed so as to extend in parallel with each of the pair of source/drain regions SD along a gate width W1 of the gate electrode GE. In plan view, the depressed portion has a length larger than that of each of the pair of source/drain regions SD. In the direction of the gate width W1, each of the end portions of the tungsten silicide film GE2 is located externally of the end portion of the corresponding one of the source/drain regions SD by a distance WD. The depressed portion SL is also formed so as to extend through the silicon nitride film HM1 and expose a part of the silicon dioxide film HM2 from the silicon nitride film HM1. The depressed portion SL has a linear portion SL1 formed in a linear shape in plan view.

Note that the depressed portion SL may also be formed continuously from one end of the tungsten silicide film GE2 in the gate width direction W1 to the other end thereof. That is, the tungsten silicide film GE2 may also be divided by the depressed portion SL.

Over the side walls of the gate insulating film GI and the gate electrode GE, the insulating films (side-wall oxide films) NO each made of, e.g., a silicon dioxide film are formed. Also, over the side walls of the laminate structure including the gate insulating film GI, the gate electrode GE, and the insulating film HM, the side-wall insulating films SW are formed so as to cover the side portions of the insulating films NO. Each of the side-wall insulating films SW may also be formed of a silicon nitride film or a combination of a silicon dioxide film and a silicon nitride film.

Over the main surface of the semiconductor substrate SUB, the insulating film NO and the interlayer insulating film II1 are formed successively in an ascending order. The insulating films NO and the interlayer insulating film II1 each over the source/drain regions SD have been selectively removed. As a result, contact holes CH1 are formed to extend through each of the insulating films NO and the interlayer insulating film II1 and reach the source/drain regions SD. In the contact holes CH1, the contact conductive layers CTC are formed to be coupled to the source/drain regions SD.

The configuration in the layers over the interlayer insulating film II1 is substantially the same as the configuration described using FIG. 3 so that a description thereof will not be repeated.

Next, a description will be given of a manufacturing method of the semiconductor device in the present embodiment.

Figure 6:
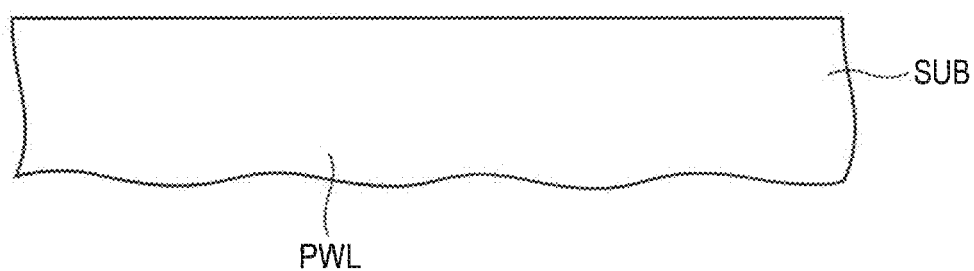
FIG. 6 is a schematic cross-sectional view showing a first step of a manufacturing method of the semiconductor device in the embodiment, which corresponds to FIG. 4.

Referring to FIG. 6, the silicon substrate SUB is provided. Then, ion implantation and heat treatment are performed to form the p-type well region PWL.

Figure 7:
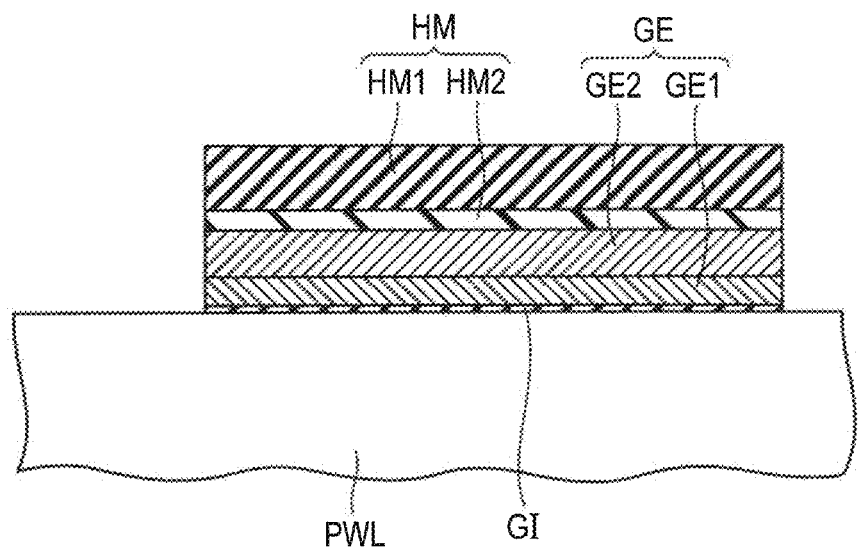
FIG. 7 is a schematic cross-sectional view showing a second step of the manufacturing method of the semiconductor device in the embodiment, which corresponds to FIG. 4.

Referring to FIG. 7, over the main surface of the silicon substrate SUB, the gate insulating film GI is formed. Over the gate insulating film GI, the gate electrode GE is formed. The gate electrode GE is formed of a so-called polycide structure in which, e.g., the doped polysilicon film GE1 and the tungsten silicide film GE2 are stacked. Over the gate electrode GE, the insulating film HM which functions as the etching stopper film at the time of SAC (Self Align Contact) in the subsequent step is formed. The insulating film HM is formed of the silicon nitride film HM1 and the silicon dioxide film (TEOS film) HM2 in multiple layers.

That is, over the doped polysilicon film GE1, the tungsten silicide film GE2 is formed. Then, over the tungsten silicide film GE2, the silicon dioxide film (TEOS film) HM2 is formed and, over the silicon dioxide film (TEOS film) HM2, the silicon nitride film HM1 is formed. Each of these films is deposited and then formed by photoengraving, dry etching, and the like.

Figure 8:
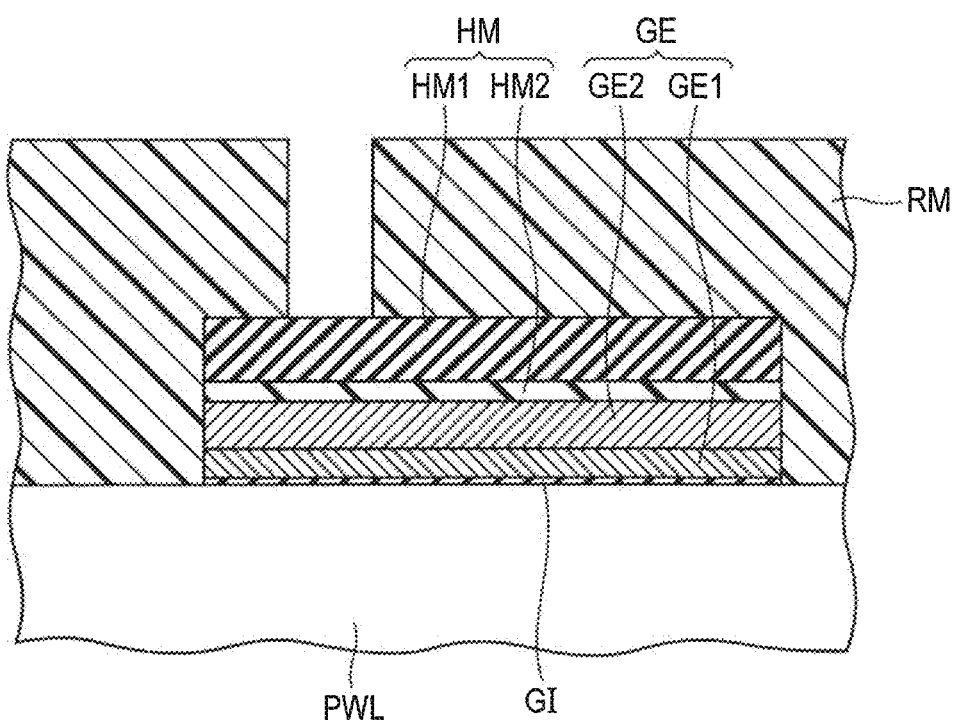
FIG. 8 is a schematic cross-sectional view showing a third step of the manufacturing method of the semiconductor device in the embodiment, which corresponds to FIG. 4.

Referring to FIG. 8, a resist pattern RM having an opening corresponding to a part of the upper surface of the silicon nitride film HM1 is formed.

Figure 9:
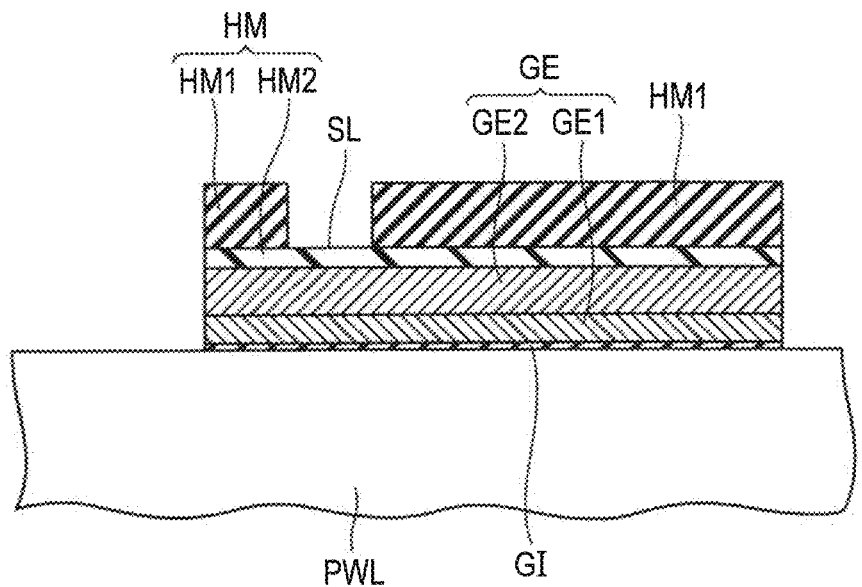
FIG. 9 is a schematic cross-sectional view showing a fourth step of the manufacturing method of the semiconductor device in the embodiment, which corresponds to FIG. 4.

Referring to FIG. 9, the depressed portion SL is formed by dry etching or the like in the upper surface of the silicon nitride film HM1 using the resist pattern RM as a mask. The depressed portion SL extends through the silicon nitride film HM1 to reach the silicon dioxide film HM2.

Figure 10:
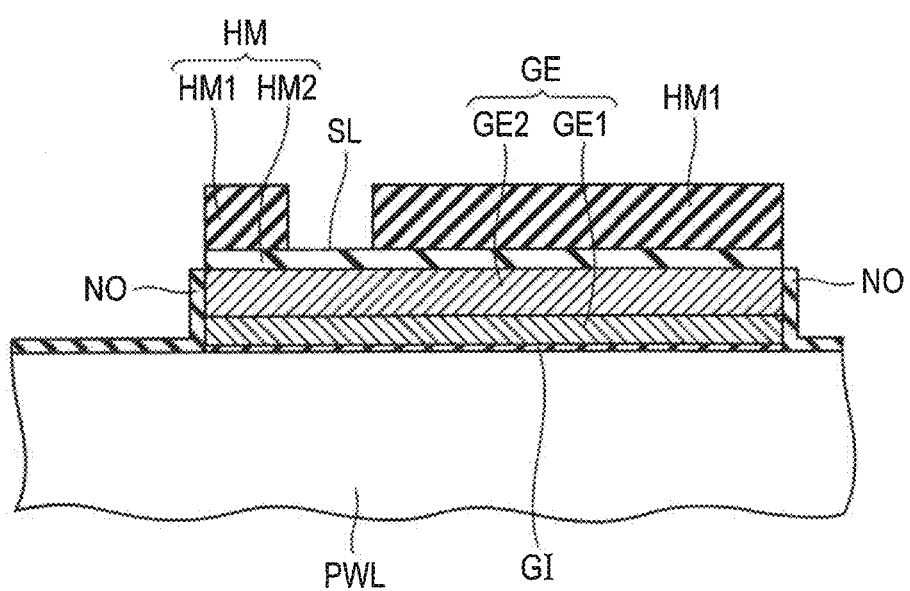
FIG. 10 is a schematic cross-sectional view showing a fifth step of the manufacturing method of the semiconductor device in the embodiment, which corresponds to FIG. 4.

Referring to FIG. 10, over the side walls of the gate electrode GE and the main surface of the semiconductor substrate SUB, the insulating films NO each made of a silicon dioxide film is formed by oxidation treatment for reducing the electric field in the transistor.

Figure 11:
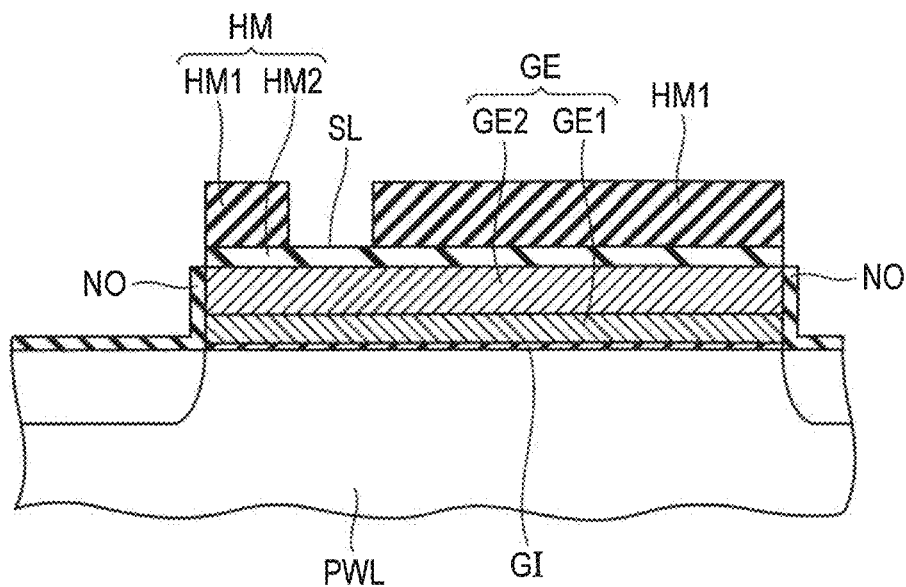
FIG. 11 is a schematic cross-sectional view showing a sixth step of the manufacturing method of the semiconductor device in the embodiment, which corresponds to FIG. 4.

Referring to FIG. 11, using the insulating film HM and the gate electrode GE as a mask, an impurity is ion-implanted into the semiconductor substrate SUB.

Figure 12:
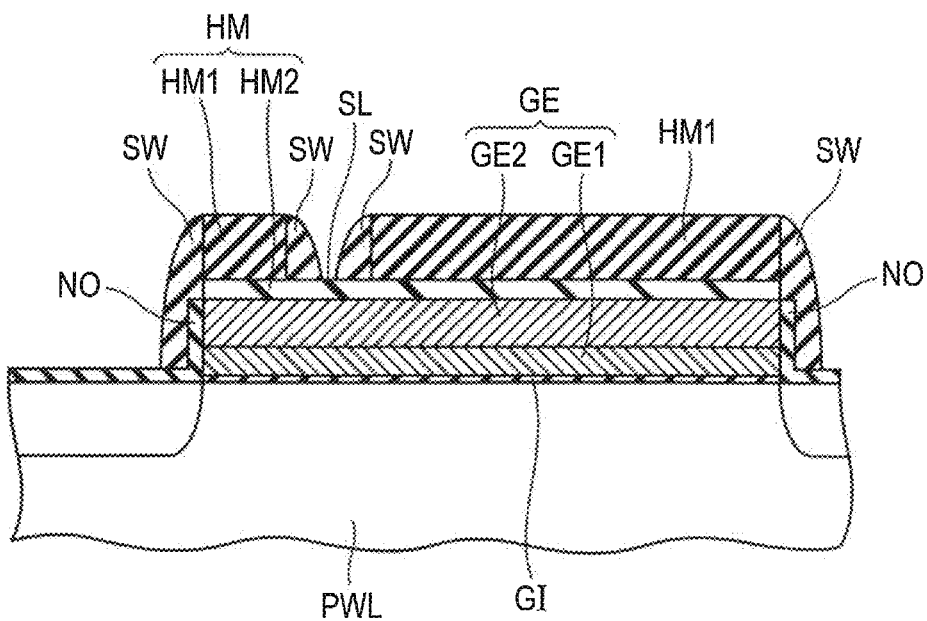
FIG. 12 is a schematic cross-sectional view showing a seventh step of the manufacturing method of the semiconductor device in the embodiment, which corresponds to FIG. 4.

Referring to FIG. 12, the side-wall insulating films SW covering the side walls of the gate insulating film GI, the gate electrode GE, and the insulating film HM are each formed of an insulating film such as a SiN film.

Figure 13:
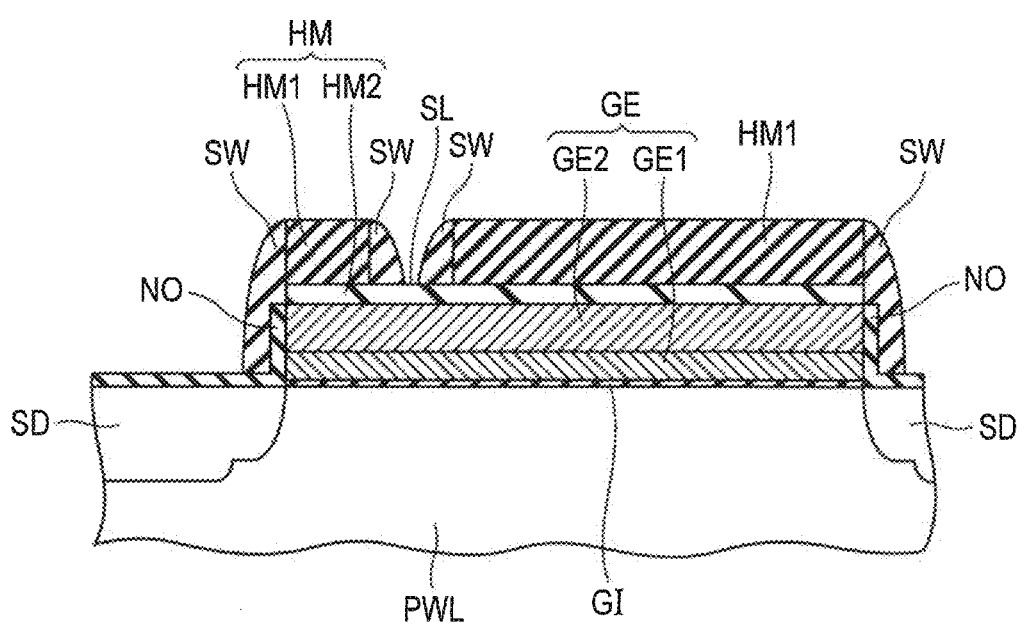
FIG. 13 is a schematic cross-sectional view showing an eighth step of the manufacturing method of the semiconductor device in the embodiment, which corresponds to FIG. 4.

Referring to FIG. 13, ion implantation for source/drain formation is further performed to form the pair of source/drain regions SD each having an LDD (Lightly Doped Drain) structure in the main surface of the semiconductor substrate SUB.

Referring to FIG. 4, subsequently, over the entire top surface, the interlayer insulating film II1 made of, e.g., BPSG (Boro Phospho Silicon Glass) or the like is formed. The interlayer insulating film II1 is subjected to heat treatment to be planarized to a given degree. Then, the interlayer insulating film is subjected to CMP (Chemical Mechanical Polishing) treatment to have the upper surface thereof planarized. Over the planarized interlayer insulating film II1, a resist pattern is formed and, using the resist pattern as a mask, the interlayer insulating film II1 is selectively removed by etching so that the contact holes CH1 are formed in the interlayer insulating film II1 to expose the source/drain regions SD. The contact conductive layers CTC made of tungsten or the like are formed so as to be embedded in the contact holes CH1.

The layers over the interlayer insulating film II1 are formed by a manufacturing method using a photoengraving technique and an etching technique in the same manner as conventionally used. In this manner, the semiconductor device in the present embodiment is manufactured.

Next, a description will be given of modifications of the present embodiment.

Figure 14:
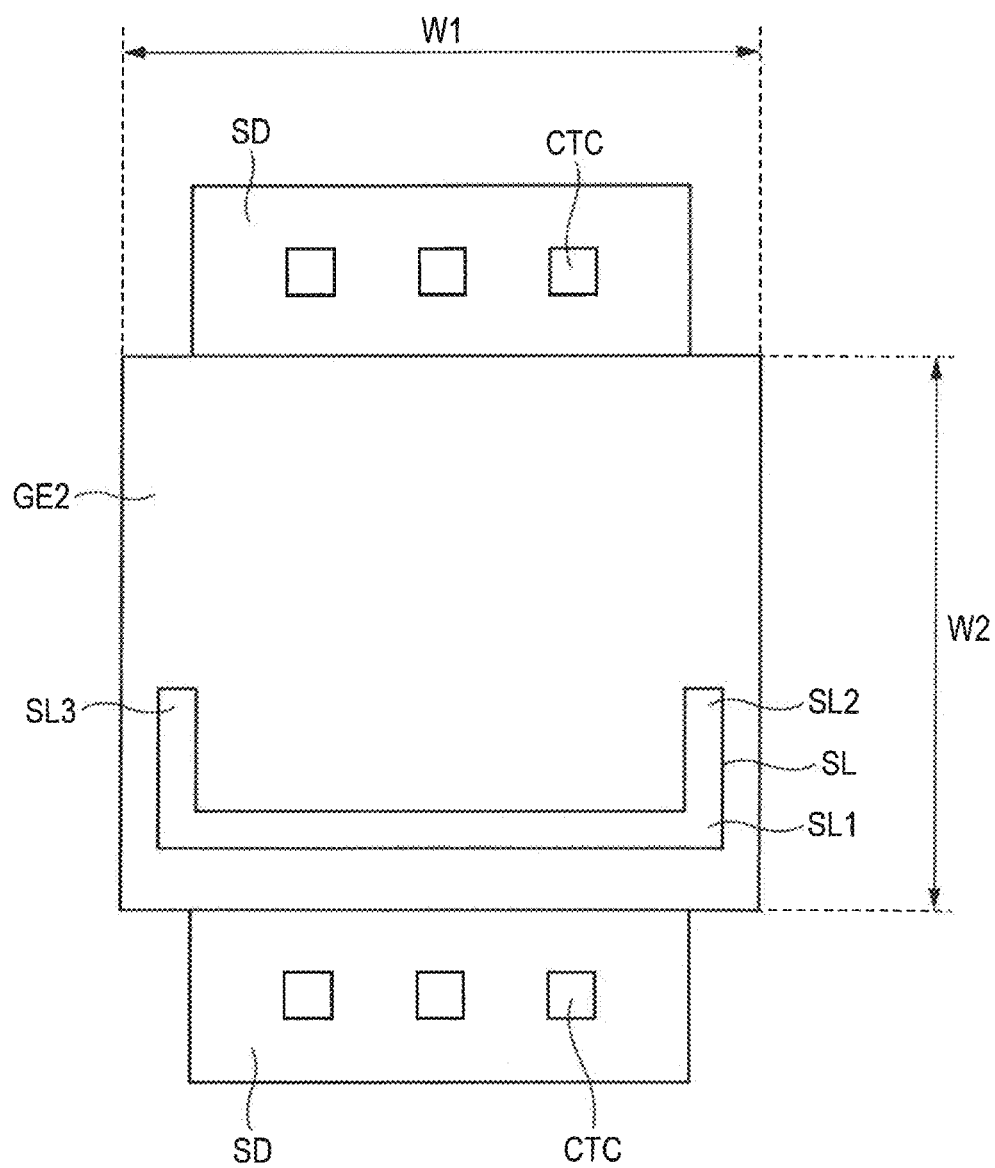
FIG. 14 is a schematic plan view showing a configuration in the vicinity of a gate electrode formed over the main surface of the semiconductor substrate of a semiconductor device in Modification 1 of the embodiment.

First, referring to FIGS. 14 and 15, a description will be given of another example of the two-dimensional shape of the depressed portion SL. In the description given above, as shown in FIG. 5, the depressed portion SL is formed in a linear shape in the upper surface of the silicon nitride film HM1. However, the two-dimensional shape of the depressed portion SL is not limited to the linear shape. As shown in FIG. 14, in the semiconductor device in Modification 1 of the present embodiment, the depressed portion SL has, in addition to the linear portion SL1 extending in the linear shape in the direction of the gate width W1 of the gate electrode GE, a first tip portion SL2 extending from one end of the linear portion SL1 in the direction of a gate length W2 of the gate electrode GE and a second tip portion SL3 extending from the other end of the linear portion SL1 in the direction of the gate length W2 of the gate electrode GE. That is, the depressed portion SL is formed in a letter-U shape in plan view.

Figure 15:
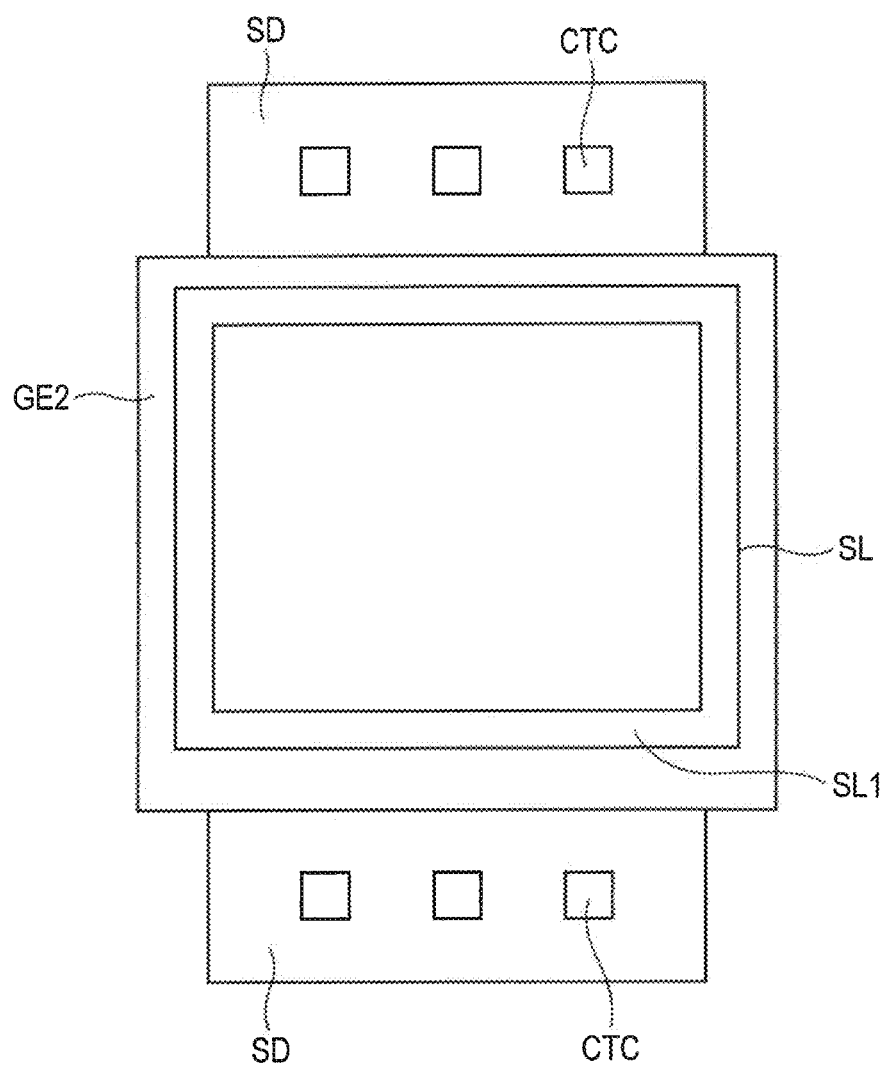
FIG. 15 is a schematic plan view showing a configuration in the vicinity of a gate electrode formed over the main surface of the semiconductor substrate of a semiconductor device in Modification 2 of the embodiment.

On the other hand, as shown in FIG. 15, in the semiconductor device in Modification 2 of the present embodiment, the depressed portion SL is formed in an annular shape in plan view. The depressed portion SL may also be formed in a rectangular shape in plan view.

Subsequently, referring to FIGS. 16 to 19, a description will be given of another example of the cross-sectional shapes of the silicon nitride film HM1 and the silicon dioxide film HM2.

Figure 16:
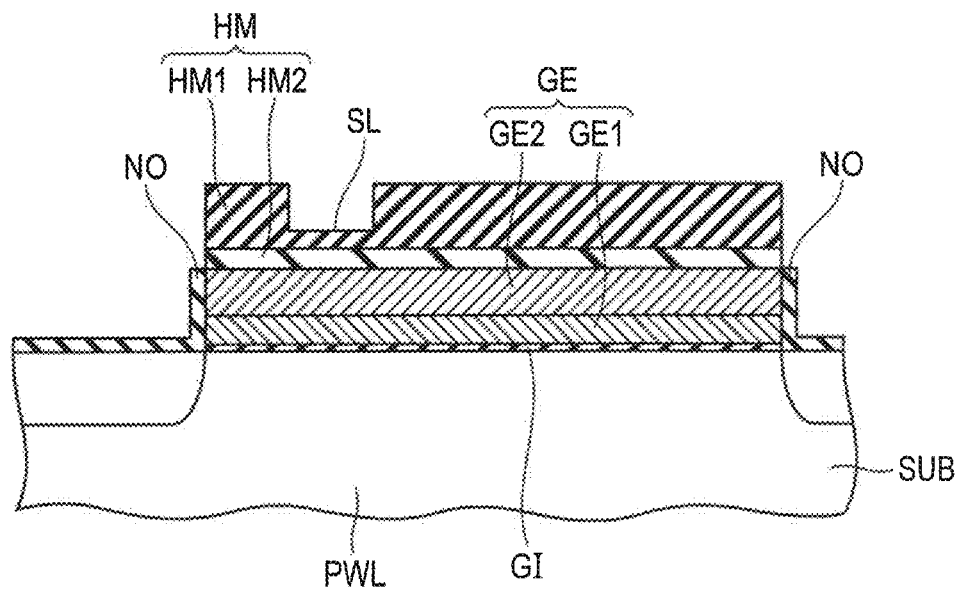
FIG. 16 is a schematic cross-sectional view of a semiconductor device in Modification 3 of the embodiment, which corresponds to FIG. 11.

In the foregoing description, as shown in FIG. 9, the depressed portion SL is formed so as to extend through the silicon nitride film HM1 and reach the silicon dioxide film HM2. However, the cross-sectional shape of the depressed portion SL is not limited thereto. As shown in FIG. 16, in Modification 3 of the present embodiment, the depressed portion SL is formed to a middle point in the thickness direction of the silicon nitride film HM1 without extending through the silicon nitride film HM1. In this state, using the insulating film HM and the gate electrode GE as a mask, an impurity is ion-implanted into the semiconductor substrate SUB and, over the side walls of the gate electrode GE and the main surface of the semiconductor substrate SUB, the insulating films NO each made of a silicon dioxide film are further formed.

Figure 17:
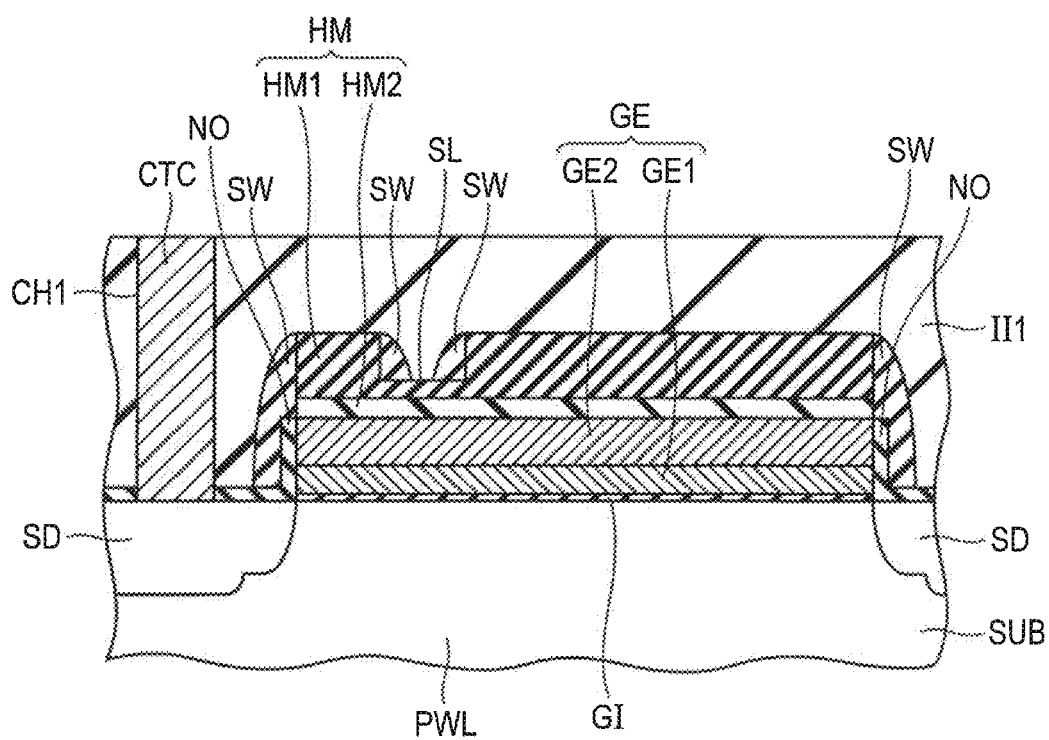
FIG. 17 is a schematic cross-sectional view showing a configuration in the vicinity of a gate electrode formed over the main surface of the semiconductor substrate of the semiconductor device in Modification 3 of the embodiment.

As shown in FIG. 17, the side-wall insulating films SW are formed so as to cover the side walls of the gate insulating film GI, the gate electrode GE, and the insulating film HM and, in the main surface of the semiconductor substrate SUB, the pair of source/drain regions SD each having an LDD structure are further formed. Then, over the entire top surface, the interlayer insulating film II1 is formed and the contact conductive layers CTC are formed so as to be embedded in the contact holes CH1 formed in the interlayer insulating film II1.

In Modification 3 of the present embodiment also, the volume of the silicon nitride film HM1 is reduced by the depressed portion SL. As a result, it is possible to suppress the shrinkage of the tungsten silicide film GE2.

Figure 18:
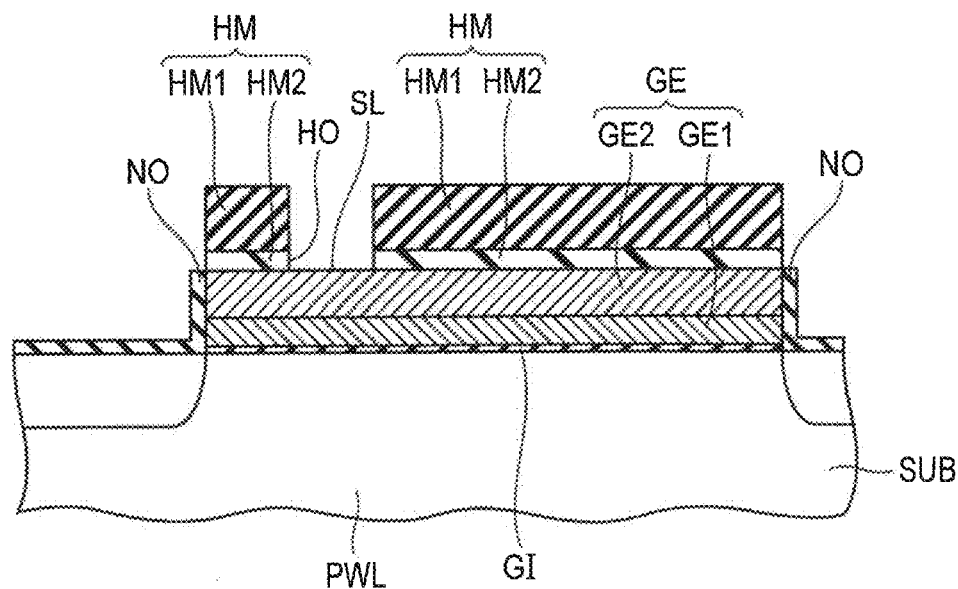
FIG. 18 is a schematic cross-sectional view of a semiconductor device in Modification 4 of the embodiment, which corresponds to FIG. 11.

As shown in FIG. 18, in Modification 4 of the present embodiment, the silicon dioxide film HM2 has a through hole HO communicating with the depressed portion SL. The depressed portion SL and the through hole HO are formed so as to expose a part of the tungsten silicide film GE2 from the silicon nitride film HM1 and the silicon dioxide film HM2. In this state, using the insulating film HM and the gate electrode GE as a mask, an impurity is ion-implanted into the semiconductor substrate SUB and, over the side walls of the gate electrode GE and the main surface of the semiconductor substrate SUB, the insulating films NO each made of a silicon dioxide film are further formed.

Figure 19:
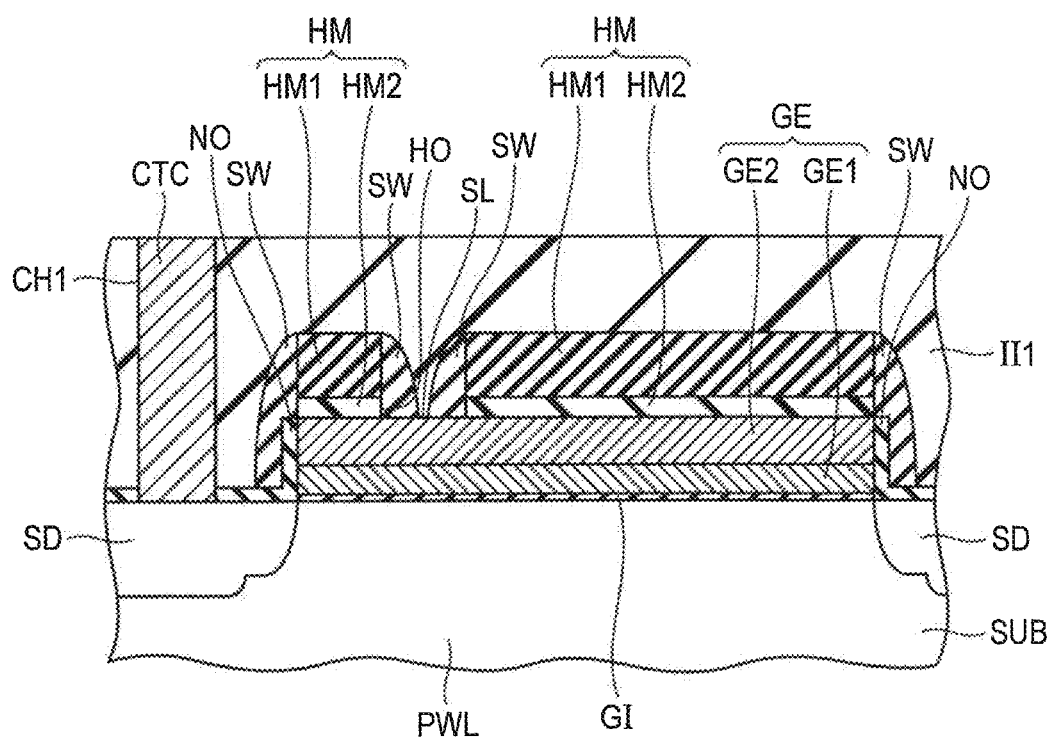
FIG. 19 is a schematic cross-sectional view showing a configuration in the vicinity of a gate electrode formed over the main surface of the semiconductor substrate of the semiconductor device in Modification 4 of the embodiment.

As shown in FIG. 19, the side-wall insulating films SW are formed so as to cover the side walls of the gate insulating film GI, the gate electrode GE, and the insulating film HM and, in the main surface of the semiconductor substrate SUB, the pair of source/drain regions SD each having an LDD structure are further formed. Then, over the entire top surface, the interlayer insulating film II1 is formed and the contact conductive layers CTC are formed so as to be embedded in the contact holes CH1 formed in the interlayer insulating film II1.

In Modification 4 of the present embodiment, during dry etching, the etching for the depressed portion SL and the through hole HO is stopped using the tungsten silicide film GE2 to allow easy manufacturing.

Next, a description will be given of the function/effect of the present embodiment in contrast to a related art technology.

Figure 20:
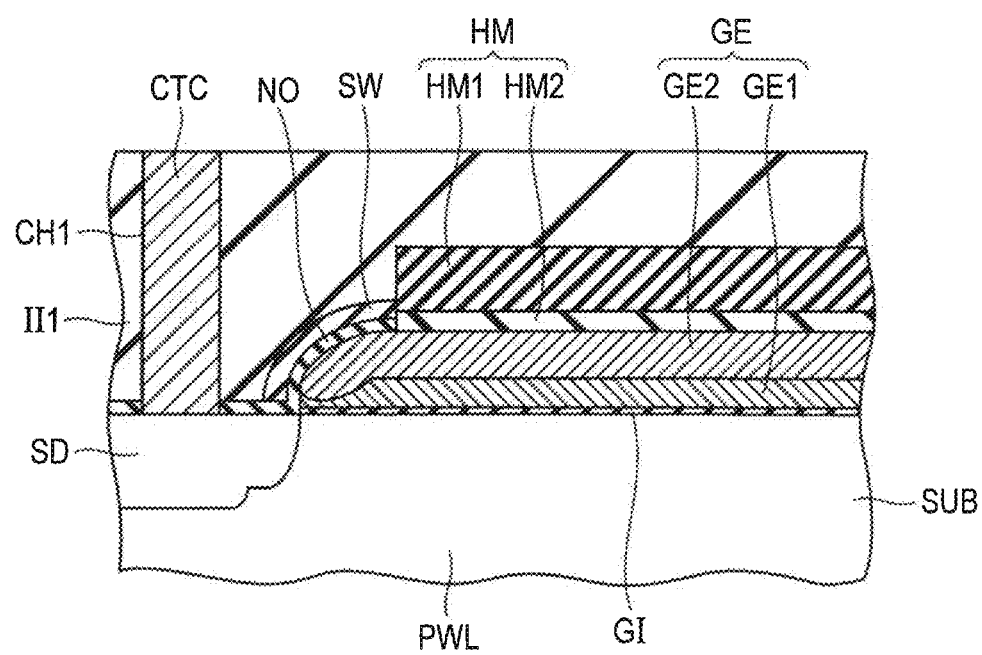
FIG. 20 is a schematic cross-sectional view showing a configuration in the vicinity of a gate electrode formed over the main surface of the semiconductor substrate of a semiconductor device in a related art technology.
Figure 21:
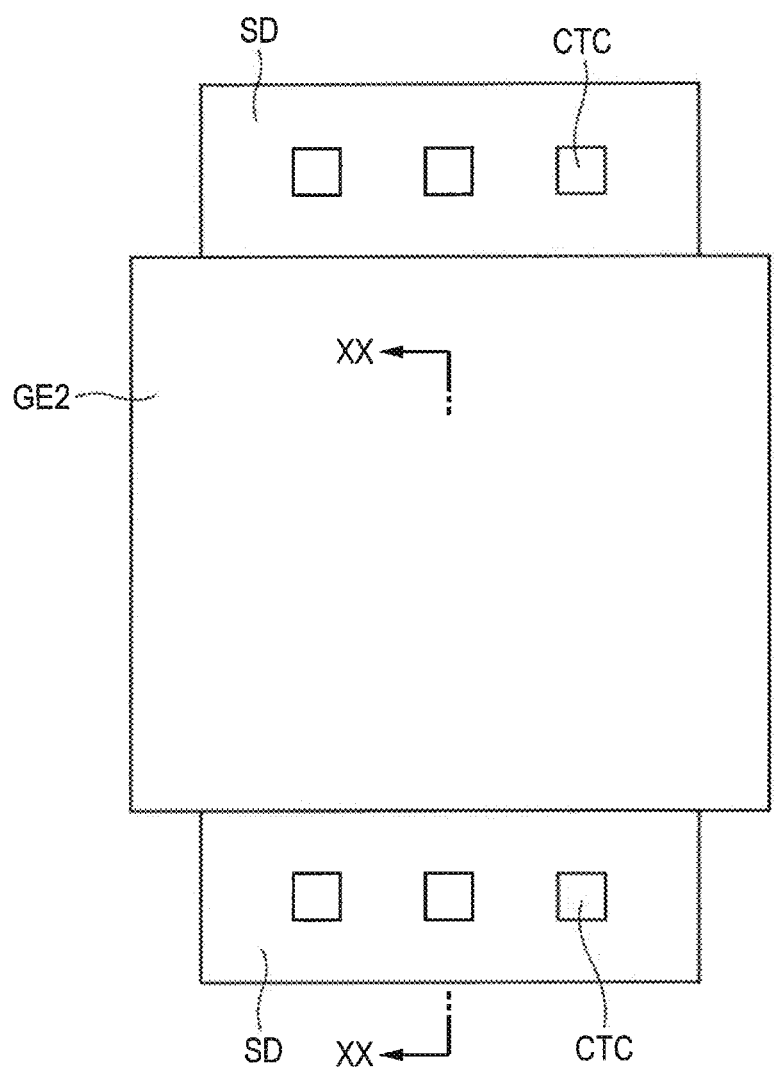
FIG. 21 is a schematic plan view showing the configuration in the vicinity of the gate electrode formed over the main surface of the semiconductor substrate of the semiconductor device in the related art technology.

Referring to FIGS. 20 and 21, a semiconductor device in the related art technology is different from the semiconductor device in the present embodiment in that, in the upper surface of the silicon nitride film HM1, the depressed portion SL is not formed. As a result, in the semiconductor device in the related art technology, the silicon nitride film HM1 and the silicon dioxide film HM2 are recessed from each of the side walls of the gate electrode GE. In addition, due to the recession of the silicon nitride film HM1 and the silicon dioxide film HM2, the portion of the tungsten silicide film GE2 which is uncovered with the silicon nitride film HM1 and the silicon dioxide film HM2 is curved toward the main surface of the semiconductor substrate SUB.

Note that the configuration of the semiconductor device in the related art technology except for the portion thereof described above is substantially the same as the configuration of the semiconductor device in the present embodiment. Therefore, the same components are designated by the same reference numerals and a description thereof will not be repeated.

Figure 22:
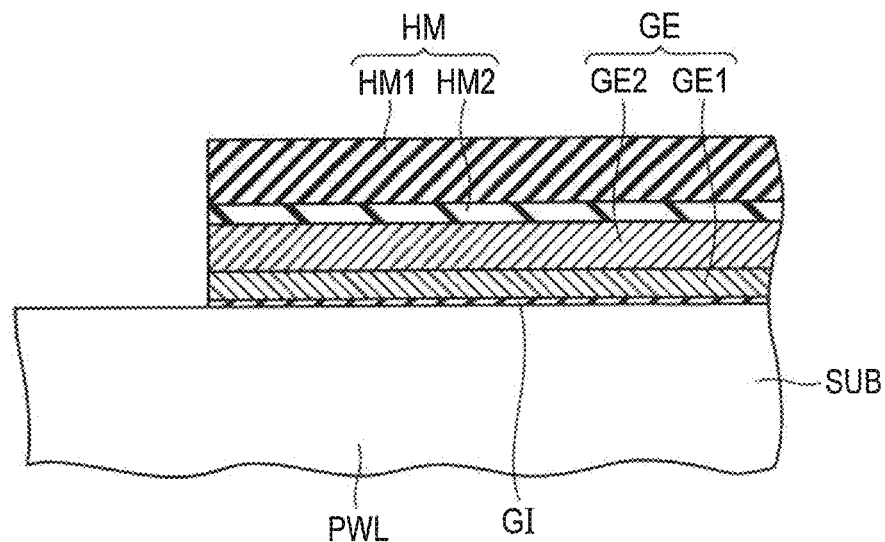
FIG. 22 is a schematic cross-sectional view of a manufacturing method of the semiconductor device in the related art technology, which corresponds to FIG. 7.

In a manufacturing method of the semiconductor device according to the related art technology, in the same manner as in the manufacturing method in the present embodiment shown in FIG. 6, the silicon substrate SUB is provided first. Then, ion implantation and heat treatment are performed to form the p-type well region PWL. Thereafter, referring to FIG. 22, over the main surface of the silicon substrate SUB, the gate insulating film GI, the gate electrode GE, and the insulating film HM are formed.

Figure 23:
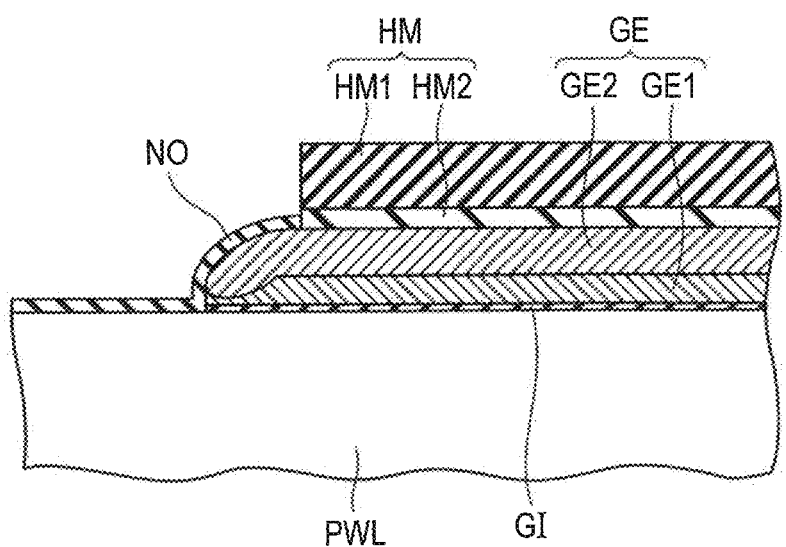
FIG. 23 is a schematic cross-sectional view of the manufacturing method of the semiconductor device in the related art technology, which corresponds to FIG. 10.

Referring to FIG. 23, over the side walls of the gate electrode GE and the main surface of the semiconductor substrate SUB, the insulating film NO made of a silicon dioxide film is formed by oxidation treatment for reducing the electric field in a transistor. As a result of the thermal treatment performed during the formation of the insulating film NO, the silicon nitride film HM1 shrinks to be recessed from the side wall of the gate electrode GE. At this time, the adhesion between the silicon nitride film HM1 and the silicon dioxide film HM2 is superior to the adhesion between the silicon dioxide film HM2 and the tungsten silicide film GE2. Accordingly, the silicon dioxide film HM2 is pulled by the silicon nitride film HM1 to be also recessed.

As a result of the shrinkage of the silicon nitride film HM1, a downward stress acts on the tungsten silicide film GE2. Consequently, the portion of the tungsten silicide film GE2 which is uncovered with the silicon nitride film HM1 as a result of the recession of the silicon nitride film HM1 is downwardly curved toward the main surface of the semiconductor substrate SUB.

Figure 24:
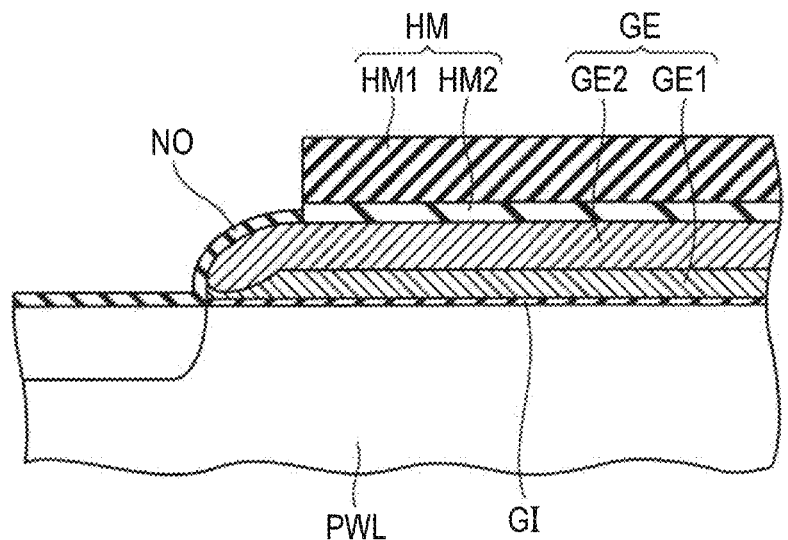
FIG. 24 is a schematic cross-sectional view of the manufacturing method of the semiconductor device in the related art technology, which corresponds to FIG. 11.

Referring to FIG. 24, using the insulating film HM and the gate electrode GE as a mask, an impurity is ion-implanted into the semiconductor substrate SUB.

Figure 25:
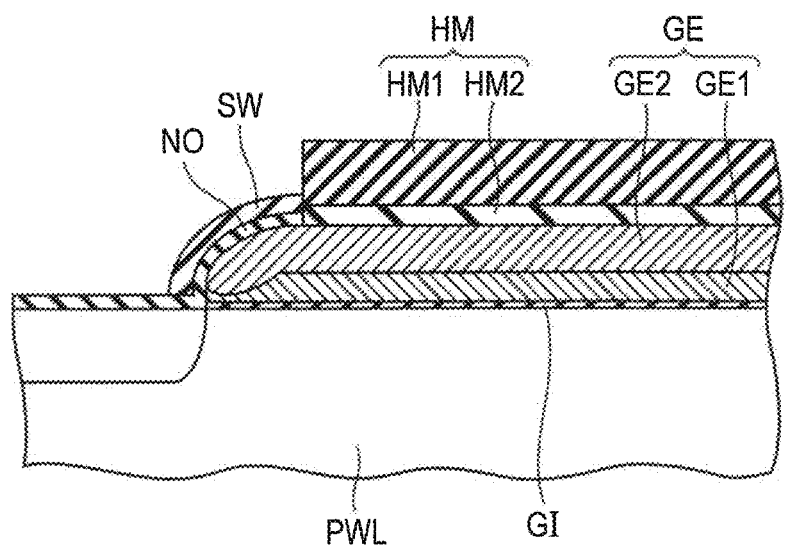
FIG. 25 is a schematic cross-sectional view of the manufacturing method of the semiconductor device in the related art technology, which corresponds to FIG. 12.
Figure 26:
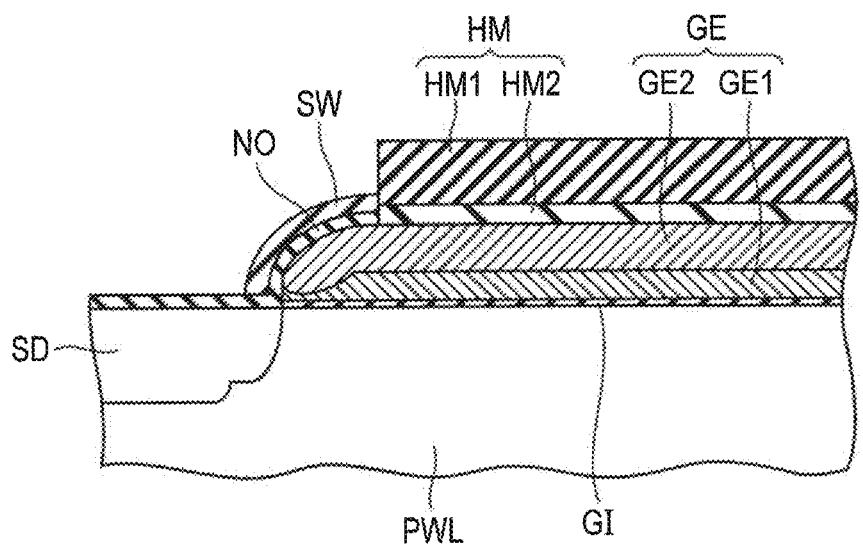
FIG. 26 is a schematic cross-sectional view of the manufacturing method of the semiconductor device in the related art technology, which corresponds to FIG. 13.

Referring to FIG. 25, the side-wall insulating films SW are each formed of an insulating film such as, e.g., a SiN film to cover the side walls of the gate electrode GE and the insulating film HM. Referring to FIG. 26, ion implantation for source/drain formation is further performed to form, in the main surface of the semiconductor substrate SUB, the pair of source/drain regions SD each having an LDD structure.

Subsequently, in the same manner as in the manufacturing method in the present embodiment, the interlayer insulating film II1 is formed, the contact holes CH1 are formed in the interlayer insulating film II1, and the contact conductive layers CTC are formed so as to be embedded in the contact holes CH1. In this manner, the semiconductor device in the related art technology is manufactured.

In the semiconductor device in the related art technology, as shown in FIG. 24, by the thermal treatment performed during the formation of the insulating film NO over each of the side walls of the gate electrode GE and the main surface of the semiconductor substrate SUB, the silicon nitride film HM1 shrinks to be recessed from each of the side walls of the gate electrode GE. As a result of the shrinkage of the silicon nitride film HM1, the portion of the tungsten silicide film GE2 which is uncovered with the silicon nitride film HM1 is downwardly curved toward the main surface of the semiconductor substrate SUB. As a result, the distance between the tungsten silicide film GE2 and each of the source/drain regions SD is reduced to result in the application of a bias, which may cause a short circuit between the tungsten silicide film GE2 and each of the source/drain regions SD. Thus, in the semiconductor device according to the related art technology, a failure may occur.

By contrast, in the present embodiment, as shown in FIGS. 4, 17, and 19, the depressed portion SL is formed in the upper surface of the silicon nitride film HM1. This suppresses the shrinkage of the silicon nitride film HM1 due to the heat treatment performed during the formation of the insulating film NO over the side walls of the gate electrode GE and the main surface of the semiconductor substrate SUB and the resulting recession of the silicon nitride film HM1 from each of the side walls of the gate electrode GE. In other words, since the volume of the tungsten silicide film GE2 placed on the side of the depressed portion SL closer to the side wall of the gate electrode GE is reduced due to the depressed portion SL, the amount of the shrinkage of the tungsten silicide film GE2 can be reduced. Accordingly, it is possible to reduce the amount of deformation of the portion of the tungsten silicide film GE2 which is uncovered with the silicon nitride film HM1 toward the main surface of the semiconductor substrate SUB. As a result, the distance between the tungsten silicide film GE2 and each of the source/drain regions SD is maintained. Therefore, it is possible to suppress a reduction in the distance between the tungsten silicide film GE2 and each of the source/drain regions SD and the resulting occurrence of a short circuit between the tungsten silicide film GE2 and either of the source/drain regions SD.

In the present embodiment, as shown in FIG. 5, the depressed portion SL is formed so as to extend in parallel with each of the pair of source/drain regions SD along the direction of the gate width W of the gate electrode GE. Therefore, it is possible to suppress the curving of the tungsten silicide film GE2 located closer to the side wall of the gate electrode GE and the resulting approach of the tungsten silicide film GE2 to the source/drain region SD.

Also in the present embodiment, as shown in FIG. 5, the depressed portion SL has a length larger than the length of each of the pair of source/drain regions SD in plan view. Accordingly, in plan view, the corner portions of the tungsten silicide film GE2 are located outside the source/drain regions SD. Since the amount of the shrinkage of the tungsten silicide film GE2 is larger at the corner portions thereof than at the center portion thereof in plan view, the location of the corner portions of the tungsten silicide film GE2 outside the source/drain regions can more reliably suppress the occurrence of a short circuit between the tungsten silicide film GE2 and either of the source/drain regions SD.

Also in the present embodiment, as shown in FIGS. 4 and 9, the depressed portion SL is formed so as to extend through the silicon nitride film HM1 and expose a part of the silicon dioxide film HM2 from the silicon nitride film HM1. As a result, the silicon nitride film HM1 is divided by the depressed portion SL. Thus, it is possible to reduce the volume of the portion the tungsten silicide film GE2 located on the side of the depressed portion SL closer to the side wall of the gate electrode GE and reduce the amount of the shrinkage of the tungsten silicide film GE2.

In the present embodiment, as shown in FIGS. 18 and 19, each of the depressed portion SL and the through hole HO is formed so as to expose a part of the tungsten silicide film GE2 from the silicon nitride film HM1 and the silicon dioxide film HM2. Thus, during dry etching, the etching for the depressed portion SL and the through hole HO is stopped using the tungsten silicide film GE2 to allow easy manufacturing.

Also in the present embodiment, as shown in FIG. 5, the depressed portion SL has the linear portion SL1 formed in a linear shape in plan view. Therefore, it is possible to suppress the deformation of the tungsten silicide film GE2 along the linear portion SL1 and the occurrence of a short circuit between the tungsten silicide film GE2 and either of the source/drain regions SD.

Also in the present embodiment, as shown in FIG. 14, the depressed portion SL also has the first and second tip portions SL2 and SL3 extending from one end and the other end of the linear portion SL1 in the direction of the gate length W2 of the gate electrode GE in plan view. Therefore, it is possible to suppress the shrinkage of the silicon nitride film HM1 in the direction of the gate length W2.

Also in the present embodiment, as shown in FIG. 15, the depressed portion SL is formed in an annular shape in plan view. Therefore, it is possible to suppress the shrinkage of the silicon nitride film HM1 around the entire periphery of the gate electrode GE in plan view. In addition, since the shape of the depressed portion SL is easily obtained by patterning, production is easy.

In the present embodiment, as shown in FIG. 10, after the silicon nitride film HM1 having the depressed portion SL is formed, the side-wall oxide films NO are formed over the side surfaces of the gate electrode GE. Therefore, it is possible to suppress the shrinkage of the silicon nitride film HM1 due to the heat treatment performed during the formation of the side-wall oxide films NO and the resulting recession of the silicon nitride film HM2 from each of the side walls of the gate electrode GE. As a result, it is possible to suppress a reduction in the distance between the tungsten silicide film GE2 and each of the source/drain regions SD and the resulting occurrence of a short circuit between the tungsten silicide film GE2 and each of the source/drain regions SD.

EXAMPLES

A description will be given below of examples.

Figure 27:
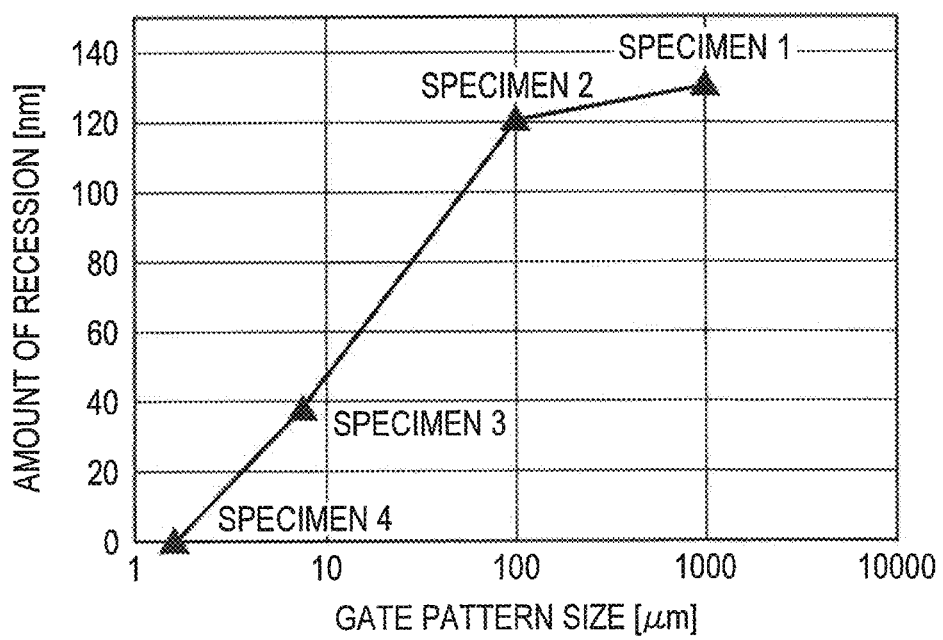
FIG. 27 is a view showing the relationship between an amount of recession and a gate pattern size in each of specimens A to D.
Figure 28:
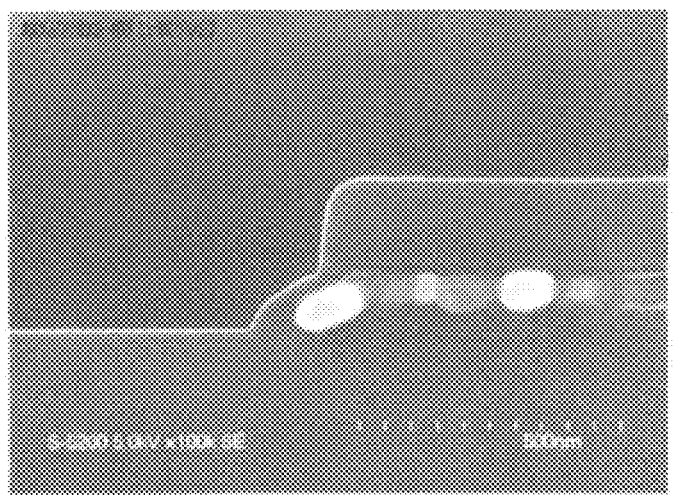
FIG. 28 is a cross-sectional view showing a configuration in the vicinity of a gate electrode formed over the main surface of the semiconductor substrate of a semiconductor device in the specimen A.
Figure 29:
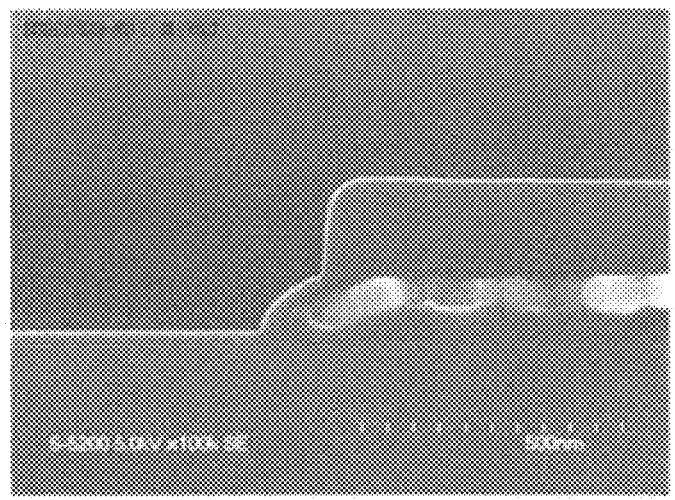
FIG. 29 is a cross-sectional view showing a configuration in the vicinity of the gate electrode formed over the main surface of the semiconductor substrate of a semiconductor device in the specimen B.
Figure 30:
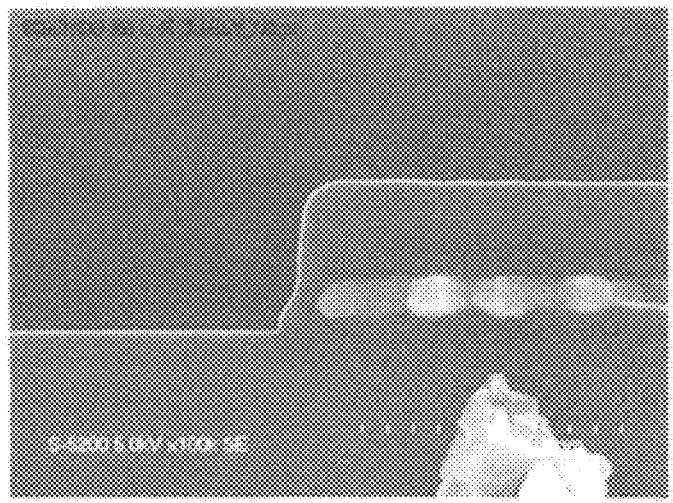
FIG. 30 is a cross-sectional view showing a configuration in the vicinity of the gate electrode formed over the main surface of the semiconductor substrate of a semiconductor device in the specimen C.
Figure 31:
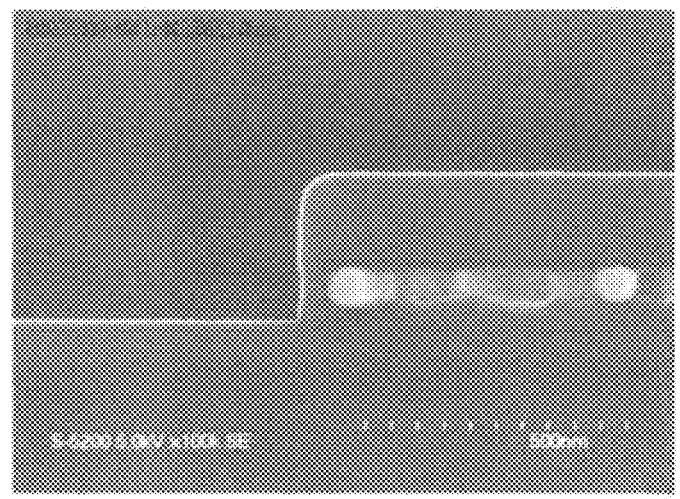
FIG. 31 is a cross-sectional view showing a configuration in the vicinity of the gate electrode formed over the main surface of the semiconductor substrate of a semiconductor device in the specimen D.

First, referring to FIGS. 27 to 31, a description will be given of the relationship between a gate pattern size and an amount of recession. The gate pattern size ($\mu$m) shown in FIG. 27 is the length of one of the four sides of the gate electrode in plan view. The amount of recession (nm) shows the amount of the recession of the silicon nitride film after the insulating film NO made of a silicon dioxide film is formed over each of the side walls of the gate electrode and the main surface of the semiconductor substrate SUB. An amount of gate distortion (nm) is the amount of deformation of a tungsten silicide film after the insulating film NO made of the silicon dioxide film is formed over the side walls of the gate electrode and the main surface of the semiconductor substrate SUB.

Each of the specimens A to D shown in FIGS. 28 to 31 has the same configuration as in the related art technology described above. As shown in FIGS. 27 to 31, the gate patterns are progressively larger in size in the order of the specimens A to D. Also, the amounts of recession are progressively larger in the order of the specimens A to D. From this, it would be understood that, as the gate pattern is larger in size, the amount of recession of the silicon nitride film is larger and the amount of gate distortion is larger. Based on the understanding, the present inventors have found that, by providing a depressed portion in the upper surface of the gate to divide the gate, the amount of gate distortion of even a gate occupying a large area can be reduced.

Note that, as a result of recognizing a cross section, the amount of deformation of the tungsten silicide film toward the main surface is about half the amount of recession of the silicon nitride film. When the thickness of the doped polysilicon film is reduced in response to a reduction in the film thickness of the gate electrode, the amount of gate distortion also needs to be reduced.

Figure 32:
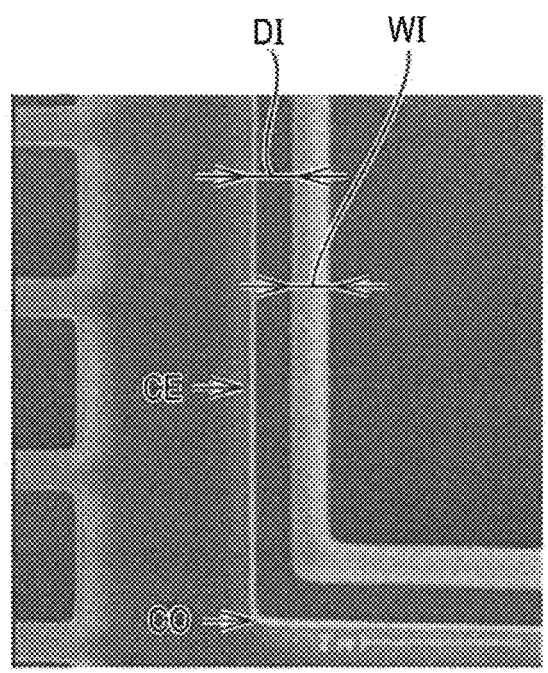
FIG. 32 is a plan view showing a configuration in the vicinity of a gate electrode formed over the main surface of a semiconductor substrate in each of Examples.
Figure 33:
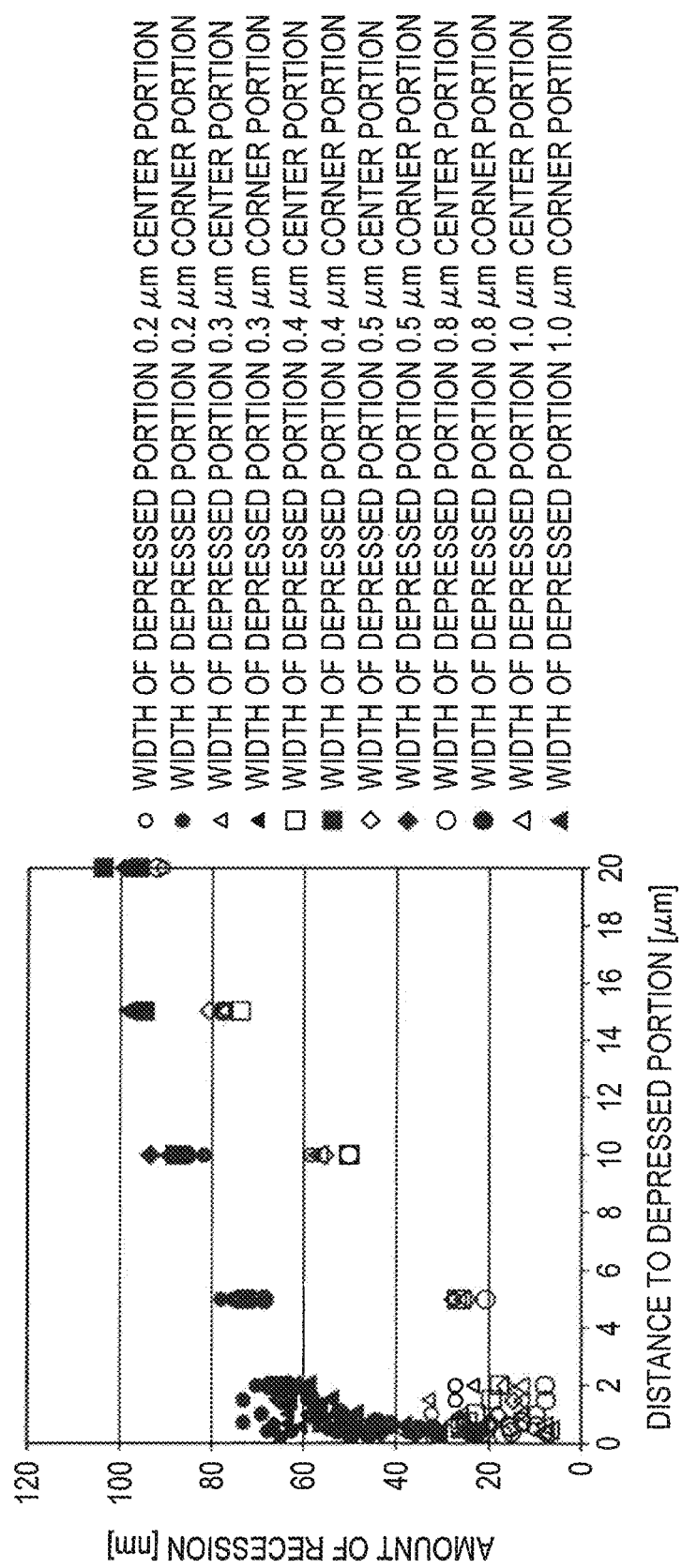
FIG. 33 is a view showing the relationship between an amount of recession and a distance to a depressed portion in each of Examples.

Subsequently, a description will be given of the relationships between the distance to the depressed portion, the width of the depressed portion, the location of the depressed portion, and the amount of recession in plan view. Referring to FIGS. 32 and 33, in a pattern in which the width of the gate electrode was 100 $\mu$m in plan view, the amounts of recession (nm) of the tungsten silicide film from the center portion CE of the gate electrode and the side wall of the corner portion CO thereof were measured while varying a width WI of the depressed portion and a distance DI to the depressed portion. Each of the amounts of recession is the distance from the side wall of the gate electrode to the end portion of the tungsten silicide film in plan view. As shown in FIG. 33, it can be seen that, as the distance DI to the depressed portion is smaller, the amount of recession is smaller. It can also be seen that the amount of recession is scarcely dependent on the width WI of the depressed portion. It can also be seen that the amount of recession is larger at the corner portion CO than at the center portion CE.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

What is claimed is:

1. A semiconductor device, comprising:
a semiconductor substrate having a main surface;
a gate electrode formed on the main surface of the semiconductor substrate;
a side-wall oxide film formed on a side wall of the gate electrode;
a first insulating layer formed on the gate electrode, the first insulating layer containing silicon nitride; and
a second insulating layer formed between the gate electrode and the first insulating layer, the second insulating layer containing silicon oxide,
wherein the gate electrode comprises i) a first electrode layer containing silicon and ii) a second electrode layer formed on the first electrode layer and containing silicide,
wherein the first insulating layer comprises i) a first upper surface opposite to the main surface and ii) a depressed portion formed in the first upper surface over the second electrode layer,
wherein the depressed portion penetrates through the first insulating layer and reaches a second upper surface of the second insulating layer without penetrating the second insulating layer,
wherein the first insulating layer further comprises a first part and a second part,
wherein the first part of the first insulating layer and the second part of the first insulating layer are separated from one another by the depressed portion such that a part of the second upper surface of the second insulating layer is exposed from between the first part of the first insulating layer and the second part of the first insulating layer while the part of the second upper surface does not overlap the first insulating layer in plan view,
wherein the second insulating layer is in direct contact with the second electrode layer and the first insulating layer, and
wherein the second upper surface of the second insulating layer is continuous and overlaps both the first part of the first insulating layer and the second part of the first insulating layer in plan view.

2. The semiconductor device according to claim 1, further comprising:
a pair of source/drain regions formed in the main surface of the semiconductor substrate with a channel formation region located under the gate electrode which is interposed between the pair of source/drain regions,
wherein the depressed portion extends along a gate width direction of the gate electrode.

3. The semiconductor device according to claim 2, wherein the depressed portion has a length greater than a length of each of the pair of source/drain regions in plan view.

4. The semiconductor device according to claim 1, wherein the depressed portion has a linear portion formed in a linear shape in plan view.

5. The semiconductor device according to claim 4, wherein the depressed portion has first and second tip portions extending respectively from one end and the other end of the linear portion in a gate length direction of the gate electrode in plan view.

6. The semiconductor device according to claim 5, wherein the depressed portion is formed in an annular shape in plan view.

* * * * *